(12) United States Patent
Melanson et al.

(10) Patent No.: US 9,497,851 B2
(45) Date of Patent: Nov. 15, 2016

(54) THERMAL MANAGEMENT IN A LIGHTING SYSTEM USING MULTIPLE, CONTROLLED POWER DISSIPATION CIRCUITS

(75) Inventors: John L. Melanson, Austin, TX (US); Eric J. King, Austin, TX (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 69 days.

(21) Appl. No.: 13/290,003

(22) Filed: Nov. 4, 2011

(65) Prior Publication Data

US 2012/0112638 A1    May 10, 2012

Related U.S. Application Data

(60) Provisional application No. 61/410,168, filed on Nov. 4, 2010.

(51) Int. Cl.
| | |
|---|---|
| H05B 37/02 | (2006.01) |
| H05K 1/02 | (2006.01) |
| H05B 33/08 | (2006.01) |

(52) U.S. Cl.
CPC ........ H05K 1/0203 (2013.01); H05B 33/0815 (2013.01); H05B 33/0854 (2013.01);
(Continued)

(58) Field of Classification Search
CPC ............ H05B 33/0815; H05B 33/0809; H05B 33/0851; H05B 33/0812; H05B
(Continued)

(56) References Cited

U.S. PATENT DOCUMENTS

| | | |
|---|---|---|
| 4,523,128 A | 6/1985 | Stamm et al. |
| 5,055,746 A | 10/1991 | Hu et al. |
| | (Continued) | |

FOREIGN PATENT DOCUMENTS

| | | |
|---|---|---|
| CN | 1421986 A | 6/2003 |
| CN | 1459216 A | 11/2004 |
| | (Continued) | |

OTHER PUBLICATIONS

Azoteq, IQS17 Family, IQ Switch -ProxSense Series, Touch Sensor, Load Control and User Interface, IQS17 Datasheet V2.00.doc, Jan. 2007, pp. 1-51, Azoteq (Pty) Ltd., Paarl, Western Cape, Republic of South Africa.

(Continued)

*Primary Examiner* — Thai Pham
*Assistant Examiner* — Borna Alaeddini

(57) ABSTRACT

A lighting system includes a controller that is configured to provide thermal management for the lighting system by distributing excess energy in the lighting system through multiple power dissipation circuits. In at least one embodiment, the lighting system is a phase cut compatible, dimmable lighting system having one or more light sources selected from a group consisting of at least one light emitting diode and at least one compact fluorescent lamp. In at least one embodiment, the controller is configured to control the plurality of power dissipation circuits in accordance with a thermal management strategy to dissipate the excess energy in the phase cut compatible, dimmable lighting system. The particular thermal management strategy is a matter of design choice. The power distribution circuits include two of more of: a controlled switch path power dissipation circuit, a controlled link path power dissipation circuit, and a controlled flyback path power dissipation circuit.

36 Claims, 19 Drawing Sheets

(52) U.S. Cl.
CPC ........... *H05B 33/08* (2013.01); *H05B 33/0809* (2013.01); *H05B 33/0812* (2013.01); *H05B 33/0818* (2013.01); *H05B 33/0824* (2013.01); *H05B 33/0827* (2013.01); *H05B 33/0845* (2013.01); *H05B 33/0851* (2013.01); *H05B 37/02* (2013.01); *Y02B 20/19* (2013.01); *Y02B 20/346* (2013.01); *Y02B 20/347* (2013.01)

(58) Field of Classification Search
CPC ........................ 33/0818;H05B 33/0827; H05B 33/0845; H05B 37/02; H05B 33/08; H05B 33/0824; H05K 1/0203; H05K 1/021
USPC ......... 315/291, 246, 247, 294, 169.1, 185 R, 315/186, 192, 56, 58, 61, 112–118, 185 S, 315/307–326, 209 R, 224, 225; 362/294, 35, 362/249.02, 249.05, 249.06, 311.02, 545, 362/362, 373, 218; 345/82, 94, 102, 204, 345/212
See application file for complete search history.

(56) References Cited

U.S. PATENT DOCUMENTS

| | | | |
|---|---|---|---|
| 5,179,324 A | 1/1993 | Audbert | |
| 5,319,301 A | 6/1994 | Callahan et al. | |
| 5,321,350 A | 6/1994 | Haas | |
| 5,430,635 A | 7/1995 | Liu | |
| 5,691,605 A | 11/1997 | Xia et al. | |
| 5,770,928 A | 6/1998 | Chansky et al. | |
| 5,963,023 A | 10/1999 | Herrell et al. | |
| 6,043,635 A | 3/2000 | Downey | |
| 6,046,550 A | 4/2000 | Ference et al. | |
| 6,091,205 A | 7/2000 | Newman et al. | |
| 6,211,624 B1 | 4/2001 | Holzer | |
| 6,343,022 B1 | 1/2002 | Naruse | |
| 6,380,692 B1 | 4/2002 | Newman et al. | |
| 6,407,514 B1 | 6/2002 | Glaser et al. | |
| 6,510,995 B2 | 1/2003 | Muthu et al. | |
| 6,621,256 B2 | 9/2003 | Muratov et al. | |
| 6,713,974 B2 | 3/2004 | Patchornik et al. | |
| 6,819,538 B2 | 11/2004 | Blaauw et al. | |
| 6,858,995 B2 | 2/2005 | Lee et al. | |
| 6,900,599 B2 | 5/2005 | Ribarich | |
| 7,102,902 B1 | 9/2006 | Brown et al. | |
| 7,180,250 B1 | 2/2007 | Gannon | |
| 7,184,937 B1 | 2/2007 | Su et al. | |
| 7,656,103 B2 | 2/2010 | Shteynberg et al. | |
| 7,719,246 B2 | 5/2010 | Melanson | |
| 7,728,530 B2 | 6/2010 | Wang et al. | |
| 7,733,678 B1 | 6/2010 | Notohamiprodjo et al. | |
| 7,759,881 B1 | 7/2010 | Melanson | |
| 7,786,711 B2 | 8/2010 | Wei et al. | |
| 7,872,427 B2 | 1/2011 | Scianna | |
| 7,969,430 B2 | 6/2011 | Korcharz et al. | |
| 8,102,167 B2 | 1/2012 | Irissou et al. | |
| 8,115,419 B2 | 2/2012 | Given et al. | |
| 8,169,154 B2 | 5/2012 | Thompson et al. | |
| 8,212,491 B2 | 7/2012 | Kost | |
| 8,212,492 B2 | 7/2012 | Lam et al. | |
| 8,222,832 B2 | 7/2012 | Zheng et al. | |
| 8,482,220 B2 | 7/2013 | Melanson | |
| 8,487,546 B2 | 7/2013 | Melanson | |
| 8,508,147 B2 | 8/2013 | Shen | |
| 8,536,794 B2 | 9/2013 | Melanson et al. | |
| 8,536,799 B1 | 9/2013 | Grisamore et al. | |
| 8,547,034 B2 | 10/2013 | Melanson et al. | |
| 8,569,972 B2 | 10/2013 | Melanson | |
| 8,610,364 B2 | 12/2013 | Melanson et al. | |
| 8,610,365 B2 | 12/2013 | King et al. | |
| 8,664,885 B2* | 3/2014 | Koolen | H05B 33/0815 315/225 |
| 8,716,957 B2 | 5/2014 | Melanson et al. | |
| 8,749,173 B1 | 6/2014 | Melanson et al. | |
| 8,847,515 B2 | 9/2014 | King et al. | |
| 9,041,311 B2* | 5/2015 | Myers | H05B 33/0815 315/291 |
| 2002/0140371 A1 | 10/2002 | Chou et al. | |
| 2004/0105283 A1 | 6/2004 | Schie et al. | |
| 2004/0164685 A1 | 8/2004 | Dygert | |
| 2004/0212321 A1 | 10/2004 | Lys | |
| 2005/0276053 A1* | 12/2005 | Nortrup | F21V 29/83 362/294 |
| 2006/0022648 A1 | 2/2006 | Ben-Yaakov et al. | |
| 2006/0208669 A1 | 9/2006 | Huynh et al. | |
| 2006/0214603 A1 | 9/2006 | Oh et al. | |
| 2007/0182338 A1 | 8/2007 | Shteynberg et al. | |
| 2007/0182347 A1 | 8/2007 | Shteynberg | |
| 2008/0018261 A1 | 1/2008 | Kastner | |
| 2008/0030143 A1 | 2/2008 | Goriki et al. | |
| 2008/0037303 A1 | 2/2008 | Mishimagi | |
| 2008/0101098 A1 | 5/2008 | Disney | |
| 2008/0143266 A1* | 6/2008 | Langer | H05B 33/0818 315/185 R |
| 2008/0192509 A1 | 8/2008 | Dhuyvetter et al. | |
| 2008/0205103 A1 | 8/2008 | Sutardja et al. | |
| 2008/0224629 A1 | 9/2008 | Melanson | |
| 2008/0224633 A1 | 9/2008 | Melanson | |
| 2008/0224636 A1 | 9/2008 | Melanson | |
| 2009/0129087 A1* | 5/2009 | Starkey | F21K 9/00 362/249.02 |
| 2009/0134817 A1 | 5/2009 | Jurngwirth et al. | |
| 2009/0135632 A1 | 5/2009 | Sohma | |
| 2009/0195186 A1 | 8/2009 | Guest et al. | |
| 2009/0244894 A1* | 10/2009 | Zhou | F21K 9/00 362/249.02 |
| 2009/0284182 A1 | 11/2009 | Cencur | |
| 2010/0002480 A1 | 1/2010 | Huynh et al. | |
| 2010/0013405 A1 | 1/2010 | Thompson et al. | |
| 2010/0013409 A1 | 1/2010 | Quek et al. | |
| 2010/0066328 A1 | 3/2010 | Shimizu et al. | |
| 2010/0164406 A1 | 7/2010 | Kost et al. | |
| 2010/0213859 A1* | 8/2010 | Shteynberg et al. | 315/224 |
| 2010/0231136 A1 | 9/2010 | Reisebauer et al. | |
| 2010/0244726 A1 | 9/2010 | Melanson | |
| 2011/0002069 A1 | 1/2011 | Yamano et al. | |
| 2011/0043133 A1 | 2/2011 | Van Laanen et al. | |
| 2011/0068712 A1* | 3/2011 | Young | H05B 33/0815 315/307 |
| 2011/0080110 A1 | 4/2011 | Nuhfer et al. | |
| 2011/0084622 A1 | 4/2011 | Barrow et al. | |
| 2011/0084623 A1 | 4/2011 | Barrow | |
| 2011/0109230 A1 | 5/2011 | Simi | |
| 2011/0115395 A1 | 5/2011 | Barrow et al. | |
| 2011/0121754 A1 | 5/2011 | Shteynberg | |
| 2011/0148318 A1 | 6/2011 | Shackle et al. | |
| 2011/0193494 A1* | 8/2011 | Gaknoki | H02M 1/4258 315/297 |
| 2011/0204797 A1 | 8/2011 | Lin et al. | |
| 2011/0204803 A1 | 8/2011 | Grotkowski et al. | |
| 2011/0234115 A1 | 9/2011 | Shimizu et al. | |
| 2011/0266968 A1 | 11/2011 | Bordin et al. | |
| 2011/0285292 A1* | 11/2011 | Mollnow | F21S 10/02 315/113 |
| 2011/0291583 A1 | 12/2011 | Shen | |
| 2011/0309759 A1 | 12/2011 | Shteynberg et al. | |
| 2012/0026761 A1* | 2/2012 | Young | H02M 7/125 363/44 |
| 2012/0049752 A1 | 3/2012 | King et al. | |
| 2012/0068626 A1 | 3/2012 | Lekatsas et al. | |
| 2012/0098454 A1 | 4/2012 | Grotkowski et al. | |
| 2012/0133291 A1 | 5/2012 | Kitagawa et al. | |
| 2012/0286686 A1 | 11/2012 | Watanabe et al. | |
| 2013/0015768 A1 | 1/2013 | Roberts et al. | |
| 2013/0154495 A1 | 6/2013 | He | |
| 2014/0009082 A1 | 1/2014 | King et al. | |

FOREIGN PATENT DOCUMENTS

| | | |
|---|---|---|
| CN | 1748446 A | 3/2006 |
| CN | 1843061 A1 | 10/2006 |

(56) References Cited

FOREIGN PATENT DOCUMENTS

| | | |
|---|---|---|
| CN | 101193474 A | 6/2008 |
| CN | 101505568 A | 8/2009 |
| CN | 101707874 A | 5/2010 |
| CN | 101790269 A | 7/2010 |
| CN | 101835314 | 9/2010 |
| CN | 101926222 | 12/2010 |
| EP | 1164819 | 12/2001 |
| EP | 2257124 A1 | 1/2010 |
| EP | 2232949 | 9/2010 |
| JP | 2008053181 A | 3/2008 |
| JP | 2009170240 A | 7/2009 |
| WO | 9917591 | 4/1999 |
| WO | 02096162 | 11/2002 |
| WO | 2006079937 | 8/2006 |
| WO | 2008029108 | 3/2008 |
| WO | 2008112822 A2 | 9/2008 |
| WO | 2010011971 A1 | 1/2010 |
| WO | WO2010011971 A1 | 1/2010 |
| WO | 2010035155 A2 | 4/2010 |
| WO | 2011008635 A1 | 1/2011 |
| WO | 2011050453 A1 | 5/2011 |
| WO | 2011056068 A2 | 5/2011 |
| WO | 2012016197 A1 | 2/2012 |
| WO | 2010027493 A2 | 3/2012 |

OTHER PUBLICATIONS

Chan, Samuel, et al, Design and Implementation of Dimmable Electronic Ballast Based on Integrated Inductor, IEEE Transactions on Power Electronics, vol. 22, No. 1, Jan. 2007, pp. 291-300, Dept. of Electron. Eng., City Univ. of Hong Kong.
Rand, Dustin, et al, Issues, Models and Solutions for Triac Modulated Phase Dimming of LED Lamps, Power Electronics Specialists Conference, 2007. PESC 2007. IEEE, Jun. 17-21, 2007, pp. 1398-1404, Boston, MA, USA.
Gonthier, Laurent, et al, EN55015 Compliant 500W Dimmer with Low-Losses Symmetrical Switches, ST Microelectronics, Power Electronics and Applications, 2005 European Conference, pp. 1-9, Aug. 7, 2006, Dresden.
Green, Peter, A Ballast That Can Be Dimmed from a Domestic (Phase Cut) Dimmer, International Rectifier, IRPLCFL3 rev.b, pp. 1-12, Aug. 15, 2003, El Segundo, California, USA.
Hausman, Don, Real-Time Illumination Stability Systems for Trailing-Edge (Reverse Phase Control) Dimmers, Lutron RTISS, Lutron Electronics Co, Dec. 2004, pp. 1-4, Coopersburg, PA, USA.
Lee, Stephen, et al, A Novel Electrode Power Profiler for Dimmable Ballasts Using DC Link Voltage and Switching Frequency Controls, IEEE Transactions on Power Electronics, vol. 19, No. 3, May 2004, pp. 847-833, City University of Hong Kong.
Engdahl, Tomi, Light Dimmer Circuits, 1997-2000, www.epanorama.net.
O'Rourke, Conan, et al, Dimming Electronic Ballasts, National Lighting Product Information Program, Specifier Reports, vol. 7, No. 3, Oct. 1999, pp. 1-24, Troy, NY, USA.

SUPERTEX Inc, 56W Off-line LED Driver, 120VAC with PFC, 160V, 350mA Load, Dimmer Switch Compatible, DN-H05, pp. 1-20, Jun. 17, 2008, Sunnyvale, California, USA.
Lutron, Why Different Dimming Ranges, http://www.lutron.com/TechnicalDocumentLibrary/LutronBallastpg3.pdf, 2002, p. 3.
Wu, Tsai-Fu, et al, Single-Stage Electronic Ballast with Dimming Feature and Unity Power Factor, IEEE Transactions on Power Electronics, vol. 13, No. 3, May 1998, pp. 586-597.
International Search Report and Written Opinion issued in the corresponding PCT Application No. PCT/US2011/059460 and mailed on Aug. 31, 2012.
Lutron, Flourescent Dimming Systems Technical Guide, copyright 2002, Why Different Dimming Ranges?, p. 3, Lutron Electronics Co., Inc., Coopersburg, PA, USA.
International Preliminary Report on Patentability issued in the corresponding PCT Application No. PCT/US2011/059460 on May 16, 2013.
First Office Action dated Feb. 16, 2015, mailed in Application No. 2011800535010, The State Intellectual Property Office of the People's Republic of China, pp. 1-5.
Search Report dated Feb. 8, 2015, mailed in Application No. 2011800535010, The State Intellectual Property Office of the People's Republic of China, pp. 1-2.
Response to the Written Opinion as filed Jan. 15, 2014, Application No. 11782742.8, European Patent Office, pp. 1-16.
Request for Continued Examination (RCE) and RCE Submission as filed in U.S. Appl. No. 13/289,931 on Jun. 26, 2014, pp. 1-16.
Final Office Action dated Feb. 26, 2014, mailed in U.S. Appl. No. 13/289,931, pp. 1-25.
Response to Non-Final Office Action dated Jul. 2, 2013, as filed in U.S. Appl. No. 13/289,931 Dec. 2, 2013, pp. 1-13.
Non-Final Office Action dated Jul. 2, 2013, mailed in U.S. Appl. No. 13/289,931, pp. 1-31.
Amanci, et al, "Synchronization System with Zero-Crossing Peak Detection Algorithm for Power System Applications", The 2010 International Power Electronics Conference, pp. 2984-2991, Toronto, Ontario, Canada.
Patterson, James, "Efficient Method for Interfacing Triac Dimmers and LEDs", National Semiconductor Corp., pp. 29-32, Jun. 23, 2011, USA.
Vainio, Olli, "Digital Filtering for Robust 50/60 Hz Zero-Crossing Detectors", IEEE Transactions on Instrumentation and Measurement, vol. 45, No. 2, pp. 426-430, Apr. 1996, University of Santa Barbara, California, USA.
SUPERTEX, Inc., HV9931 Unity Power Factor LED Lamp Driver, pp. 1-7, 2005, Sunnyvale, California, USA. (Per MPEP 609.04(a), Applicant points out that the year of publication is sufficiently earlier than the effective U.S. filing date and any foreign priority date so that the particular month of publication is not in issue.).
Second Office Action dated Dec. 17, 2015, mailed in Application No. 2011800535010, The State Intellectual Property Office of the People's Republic of China, pp. 1-4.

* cited by examiner

THERMAL MANAGEMENT IN A LIGHTING SYSTEM USING MULTIPLE, CONTROLLED POWER DISSIPATION CIRCUITS

CROSS-REFERENCE TO RELATED APPLICATION

This application claims the benefit under 35 U.S.C. §119 (e) and 37 C.F.R. §1.78 of U.S. Provisional Application No. 61/410,168, filed on Nov. 4, 2010, and is incorporated by reference in its entirety.

BACKGROUND OF THE INVENTION

1. Field of the Invention

The present invention relates in general to the field of electronics, and more specifically to a method and system for providing thermal management in a lighting system using multiple, controlled power dissipation circuits.

2. Description of the Related Art

The development and use of energy efficient technologies continues to be a high priority for many entities including many companies and countries. One area of interest is the replacement of incandescent lamps with more energy efficient lamps such as lamps based on electronic light sources. For this description, electronic light sources are light emitting diodes (LEDs) or compact fluorescent lamps (CFLs). As subsequently discussed with reference to FIG. 4, electronic light sources use significantly less energy per lumen of light output than incandescent lamps. In other words, for a given amount of energy, an LED and a CFL are much brighter than an incandescent lamp.

The development of electronic light source based lamps and are not without many challenges. One of the challenges is developing electronic light source based lamps that are compatible with existing infrastructure. Another challenge is dissipating heat in electronic light source based lamps. The following discussion focuses on LED-based lighting systems but is also applicable to CFL-based lighting systems and combination LED and CFL based lighting systems.

FIG. 1 depicts an exemplary LED-based lamp 100 that at least attempts compatibility with the existing infrastructure. The lamp 100 includes a threaded body 102 designed for compatibility with existing incandescent lamp sockets. In other embodiments, the lamp 100 simply has a 2-wire or 3-wire connector (not shown). The lamp 100 receives power from a voltage source 104. Voltage source 104 provides an input supply voltage $V_{IN}$, which is, for example, a nominally 60 Hz/110 V line voltage in the United States of America or a nominally 50 Hz/220 V line voltage in Europe. Dimmer 102 phase cuts the input supply voltage $V_{IN}$ to generate the phase cut input voltage $V_{\phi R\_IN}$. Incandescent lamps operate directly from the phase cut input voltage $V_{\phi R\_IN}$. However, the LEDs 108 operate from an approximately constant output voltage $V_{LD}$ and draw an approximately constant current $i_{LED}$ for a given brightness.

The lamp 100 includes power conversion circuitry 110 to convert the phase cut input voltage $V_{\phi\_IN}$ and the dimmer input current $i_{DIM}$ into the output voltage $V_{LD}$ and output current $i_{LED}$ utilized by LEDs 108. The power conversion circuitry 110 includes an interface 112 to rectify the phase cut input voltage $V_{\phi\_IN}$ and provide electromagnetic interference (EMI) protection. A boost-type switching power converter 114 converts the phase cut input voltage $V_{\phi\_IN}$ into a regulated, approximately constant link voltage $V_{LINK}$. A transformer circuit 116 converts the link voltage $V_{LINK}$ into the output voltage $V_{LD}$. The power conversion circuitry 110 also includes a controller 118 to control the conversion of power by the switching power converter 114 and transformer circuit 116. A lens 120 encloses the LEDs 108 for protection and light diffusion.

The LEDs 108 generate heat, and heat can degrade and shorten the life span of the LEDs 108. To help manage the heat generated by the LEDs 108, the lamp 100 includes a heat sink 122 that surrounds the LEDs 108 and provides conductive cooling.

The power conversion circuitry 110 also generates heat during operation. Many of the components of lamp 100 become static heat sources. Additionally in some instances, as subsequently discussed in more detail, the Power In to the lamp 100 exceeds the Power Out demands of the LEDs 108 plus any inherent power losses. Switching power converters convert power received from a power source, such as a voltage supply, into power suitable for a load. The power received from the voltage supply 104 is referred to as "POWER IN", and the power provided to the LEDs 108 is referred to as "POWER OUT". All switching power converters have some inherent power losses due to, for example, non-ideal component characteristics. Such inherent power losses tend to be minimized so as to increase the efficiency of the switching power converters. Inherent power losses are represented herein by "$P_{INH}$". In some contexts, the amount of power supplied to the switching power converter can exceed the amount of power provided by the switching power converter to a load, i.e. POWER IN>POWER OUT+$P_{INH}$. When the POWER IN is greater than the POWER OUT+$P_{INH}$, the boost switching power converter 114 passively dissipates the excess energy using the passive, power dissipation resistor 126.

A dimmable lighting system that includes a low power lamp, such as one or more light emitting diodes (LEDs), represents one context when the POWER IN to the switching power converter can be greater than the POWER OUT $P_{INH}$ of the switching power converter. In this exemplary context, the switching power converter receives current through a triode for alternating current ("triac") based dimmer. Once a triac-based dimmer begins conducting during a cycle of an alternating current ("AC") supply voltage to prevent the triac from disadvantageously, prematurely disconnecting during mid-cycle of the supply voltage, the switching power converter draws a minimum current referred to as a "hold current". As long as an input current to the switching power converter is greater than or equal to the hold current, the triac-based dimmer should not prematurely disconnect. For a leading edge dimmer, a premature disconnect occurs when the dimmer begins conducting and stops conducting prior to reaching a zero crossing of the supply voltage. Premature disconnects can cause problems with the lighting system, such as flicker and instability.

Thus, to prevent premature disconnection of the triac-based dimmer, the minimum POWER IN to the switching power converter equals the hold current ("$i_{HOLD}$") times an input voltage "$V_{IN}$" to the switching power converter. Conventional triac-based dimmers were designed to provide power to incandescent light bulbs. For desired dimming levels, an incandescent light bulb generally draws a current at least equal to the hold current for all usable dimming levels. However, other lamps, such as LEDs are more efficient than incandescent light bulbs in terms of power versus light output and, thus, provide equivalent light output while using less power than an incandescent light bulb. Thus, lighting systems with LEDs typically utilize less power and less current than incandescent bulbs. To balance the power when the lighting system draws more POWER IN than the lighting system inherently dissipates and provides as POWER OUT to the lamp, the lighting system utilizes one or more passive resistors to internally dissipate excess power.

Thus, in addition to heat generated by lamp 100 during normal operation, the lamp 100 dissipates excess energy in the form of heat represented by the difference between the POWER IN and POWER OUT+$P_{INH}$. The power conversion circuitry 110 includes a power dissipation resistor 126 to dissipate the excess energy in the form of heat. The power conversion circuitry 110 is generally surrounded by stabilizing material 124, such as potting compound, 124 to provide structural support. However, the potting compound tends to thermally insulate the power conversion circuitry 110. Thus, the energy dissipated by power conversion circuitry 110 including the power dissipation resistor 126 tends to remain statically concentrated.

FIGS. 2, 3, and 4 describe power conversion circuitry in a lighting system in more detail. FIG. 2 depicts a lighting system 200 that includes a leading edge, phase-cut dimmer 202. FIG. 3 depicts ideal, exemplary voltage graphs 300 associated with the lighting system 200. Referring to FIGS. 2 and 3, the lighting system 200 receives an AC supply voltage $V_{IN}$ from voltage supply 104. The leading edge dimmer 102 phase cuts leading edges, such as leading edges 304 and 306, of each half cycle of supply voltage $V_{IN}$. Since each half cycle of supply voltage $V_{IN}$ is 180 degrees of the input supply voltage $V_{IN}$, the leading edge dimmer 202 phase cuts the supply voltage $V_{IN}$ at an angle greater than 0 degrees and less than 180 degrees. Generally, the voltage phase cutting range of a leading edge dimmer 202 is 20 degrees to 170 degrees. "Phase cutting" the supply voltage refers to modulating a leading edge phase angle of each cycle of an alternating current ("AC") supply voltage. "Phase cutting" of the supply voltage is also commonly referred to as "chopping". Phase cutting the supply voltage reduces the average power supplied to a load, such as a lighting system, and thereby controls the energy provided to the load.

The input signal voltage $V_{\phi\_IN}$ to the lighting system 200 represents a dimming level that causes the lighting system 200 to adjust power delivered to a lamp 222, and, thus, depending on the dimming level, increase or decrease the brightness of the lamp 222. Many different types of dimmers exist. In general, dimmers use a digital or analog coded dimming signal that indicates a desired dimming level. For example, the triac-based dimmer 202 phase cuts a leading edge of the AC input supply voltage $V_{IN}$. The leading edge dimmer 202 can be any type of leading edge dimmer such as a triac-based leading edge dimmer available from Lutron Electronics, Inc. of Coopersberg, Pa. ("Lutron"). A triac-based leading edge dimmer is described in the Background section of U.S. patent application Ser. No. 12/858,164, entitled Dimmer Output Emulation, filed on Aug. 17, 2010, and inventor John L. Melanson.

The phase cut dimmer 202 supplies the input voltage $V_{\phi\_IN}$ as modified by the phase cut dimmer 202 to a full bridge diode rectifier 206. The full bridge rectifier 206 supplies an AC rectified voltage $V_{\phi R\_IN}$ to the switching power converter 208. Capacitor 220 filters high frequency components from rectified voltage $V_{\phi R\_IN}$. To control the operation of switching power converter 208, controller 220 generates a control signal $CS_0$ to control conductivity of field effect transistor (FET) switch 212. The control signal $CS_0$ is a pulse width modulated signal. Control signal $CS_0$ waveform 214 represents an exemplary control signal $CS_0$. The controller 220 generates the control signal $CS_0$ with two states as shown in the waveform 214. Each pulse of control signal $CS_0$ turns switch 212 ON (i.e. conducts) represents a first state that causes the switch 212 to operate efficiently and minimize power dissipation by the switch 212. During each pulse of control signal $CS_0$, the inductor current $i_L$ increases, as shown in the exemplary inductor current waveform 215, to charge inductor 216 during a charging phase $T_C$. Diode 218 prevents current flow from link capacitor 220 into switch 212. When the pulse of control signals $CS_0$ ends, the control signal $CS_0$ is in a second state, and the inductor 216 reverses voltage polarity (commonly referred to as "flyback"). The inductor current $i_L$ decreases during the flyback phase $T_{FB}$, as shown in inductor current waveform 215. The inductor current $i_L$ boosts the link voltage across the link capacitor 220 through diode 218. When the flyback phase $T_{FB}$ ends and when the next charging phase $T_C$ begins depends on the operating mode of the switching power converter. In discontinuous conduction mode (DCM), the flyback phase $T_{FB}$ ends before the next charging phase $T_C$ begins. However, regardless of whether the switching power converter 208 operates in discontinuous conduction mode, continuous conduction mode, or critical conduction mode, the flyback phase $T_{FB}$ begins as soon as the charging phase $T_C$ ends.

The switching power converter 208 is a boost-type converter, and, thus, the link voltage $V_{LINK}$ is greater than the rectified input voltage $V_{\phi R\_IN}$. Controller 220 senses the rectified input voltage $V_{\phi R\_IN}$ at node 224 and senses the link voltage $V_{LINK}$ at node 226. Controller 220 operates the switching power converter 208 to maintain an approximately constant link voltage $V_{LINK}$ for lamp 222, provide power factor correction, and correlate the link current $i_{LINK}$ with the phase cut angle of the rectified input voltage $V_{\phi R\_IN}$. Lamp 222 includes one or more LEDs or CFLs.

FIG. 3 depicts an exemplary light output/power graph 800 that compares light output per watt of power for an exemplary incandescent bulb and an exemplary light emitting diode (LED). Per watt of power, LEDs provide more light output than incandescent light bulbs. The low power usage by LEDs correlates to a relatively low operating current compared to the operating current for an incandescent light bulb. Since the light output of LEDs is approximately linear with power and LEDs operate at an approximately constant voltage, operating current for an LED decreases approximately linearly with decreasing light output and power.

Referring to FIGS. 2, 3, and 4, to decrease the light output of the lamp 222, the phase cut dimmer 202 increases the phase cut angle of the rectified input voltage $V_{\phi R\_IN}$, i.e. time $T_{OFF}$ increases and time $T_{ON}$ decreases. The controller 220 responds to the increased phase cut angle by decreasing the current $i_{LINK}$ provided to the lamp 222, which decreases the light output of the lamp 222.

The switching power converter 208 includes a power dissipation resistor 228 so that the dimmer current $i_{DIM}$ does not fall below the hold current value and prematurely disconnect during a cycle of the rectified input voltage $V_{\phi R\_IN}$. The "POWER IN" supplied to the switching power converter 208 equals $V_{\phi\_IN} \cdot i_{DIM}$. The "POWER OUT" supplied by switching power converter 208 equals $V_{LINK} \cdot i_{LINK}$. Because of the relatively low power requirements of an LED based lamp 222, particularly at low light output levels, if the POWER IN equals the POWER OUT+$P_{INH}$, the dimmer current $i_{DIM}$ may fall below the hold current value and cause the phase-cut dimmer 202 to prematurely disconnect. In this situation, to prevent the dimmer current $i_{DIM}$ from falling below the hold current value, the controller 220 causes the switching power converter 208 to maintain the dimmer current $i_{DIM}$ above the hold current value, which causes the POWER IN to be greater than the POWER OUT+$P_{INH}$. Since the POWER IN is greater than the POWER OUT+$P_{INH}$, the switching power converter 208 dissipates the excess power through power dissipation resistor 228.

Because of component non-idealities, the switching power converter 208 includes inherent power losses. Inherent power losses include conductor resistances and switching losses in switch 212. However, circuits are generally designed to minimize inherent power losses, and these inherent power losses are often negligible and, thus, insufficient to dissipate enough power to compensate for the difference between the POWER IN and the POWER OUT+$P_{INH}$ at some POWER OUT levels. To increase the power loss of switching power converter so that the dimmer current $i_{DIM}$ remains above a hold current value even at lower power demand by the lamp 222, switching power converter 208 includes the resistor 228 to create a passive power loss when switch 212 conducts the inductor current $i_L$. For negligible inherent power losses, the resistance value of the resistor 228 is selected so that when the switching power converter is providing a minimum link current $i_{LINK}$, the POWER IN=POWER OUT+$P_{INH}$+PASSIVE POWER DISSIPATE.

Resistor 228 is relatively cheap to implement as part of switching power converter 208. However, when the link current $i_{LINK}$ is sufficiently high such that POWER IN equals POWER OUT+$P_{INH}$, the dimmer input current $i_{DIM}$ could be maintained above the hold current value without dissipating power through resistor 228. However, since the dimmer input current $i_{DIM}$ always flows through the resistor 228 when the switch 208 is conducts, the resistor 228 still passively dissipates power regardless of whether the POWER IN is equal to the POWER OUT+$P_{INH}$, which decreases the efficiency of lighting system 200.

SUMMARY OF THE INVENTION

In one embodiment of the present invention, an apparatus includes a controller configured to control a plurality of power dissipation circuits in accordance with a thermal management strategy to dissipate excess energy in a phase cut compatible, dimmable lighting system having one or more light sources selected from a group consisting of at least one light emitting diode and at least one compact fluorescent lamp.

In another embodiment of the present invention, a method includes controlling a plurality of power dissipation circuits in accordance with a thermal management strategy to dissipate excess energy in a phase cut compatible, dimmable lighting system having one or more light sources selected from a group consisting of at least one light emitting diode and at least one compact fluorescent lamp.

In a further embodiment of the present invention, an apparatus includes means for controlling a plurality of power dissipation circuits in accordance with a thermal management strategy to dissipate excess energy in a phase cut compatible, dimmable lighting system having one or more light sources selected from a group consisting of at least one light emitting diode and at least one compact fluorescent lamp.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A lighting system includes a controller that is configured to provide thermal management for the lighting system by distributing excess energy in the lighting system through multiple power dissipation circuits. In at least one embodiment, the lighting system is a phase cut compatible, dimmable lighting system having one or more light sources selected from a group consisting of at least one light emitting diode and at least one compact fluorescent lamp. Thus, in at least some embodiments, the lighting system is an LED-based lighting system, a CFL-based lighting system, and/or a combination LED-based and CFL-based lighting system. In at least one embodiment, the controller is configured to control the plurality of power dissipation circuits in accordance with a thermal management strategy to dissipate the excess energy in the lighting system. In at least one embodiment, the controller is also configured to control a switching power converter of the lighting system. The excess energy to be dissipated includes energy received by the switching power converter that is greater than an amount of energy to be provided to a load coupled to the switching power converter.

The power dissipation circuits are physically disposed in multiple locations in the lighting system so that power can be dissipated in different physical locations with the lighting system. In at least one embodiment, the power dissipation circuits are disposed within a housing of an LED-based lamp. The particular thermal management strategy is a matter of design choice. In at least one embodiment, the thermal management strategy distributes the excess energy in a manner that approximately evenly distributes heat generated by the excess energy among the power dissipation circuits. In at least one embodiment, the controller dynamically manages power dissipation among the power dissipation circuits in accordance with the thermal management strategy. In at least one embodiment, the controller distributes more power dissipation to power distribution circuits that are less active because the less active circuits have lower inherent heat generation and, thus, can better tolerate additional heat generated by the excess energy.

The particular type, operation, and physical location of the power dissipation circuits is a matter of design choice. In at least one embodiment, the power distribution circuits include at least two and can include all of the following power dissipation circuits: a controlled switch path power dissipation circuit, a controlled link path power dissipation circuit, and a controlled flyback path power dissipation circuit.

Figure 5:
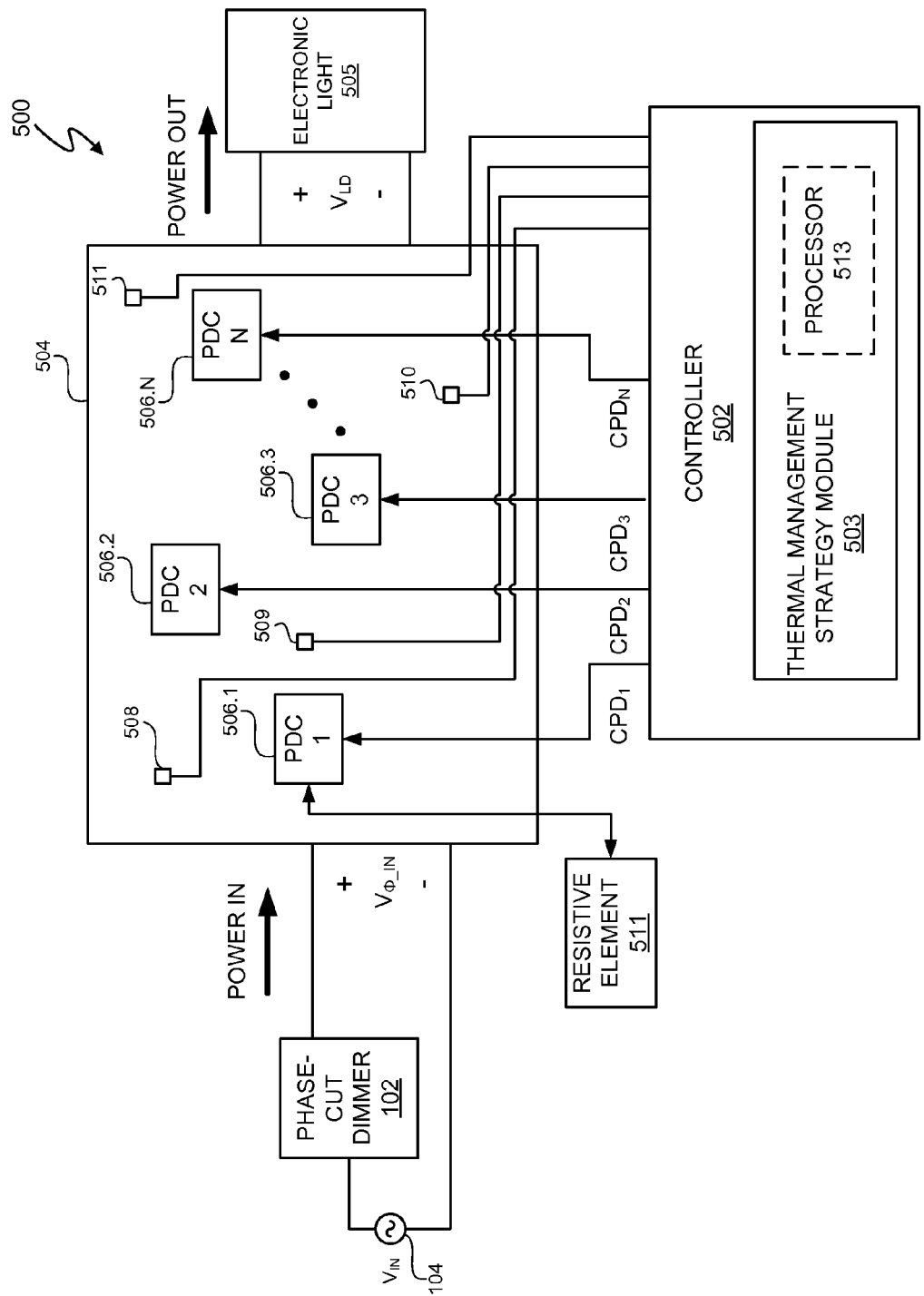
FIG. 5 depicts a lighting system that includes a controller 502 that is configured to provide thermal management for the lighting system.

FIG. 5 depicts a lighting system 500. The lighting system 500 includes a controller 502 that is configured to provide thermal management for the lighting system 500. When the power in is greater than the power out of the power conversion circuitry 504 plus any inherent power losses (often referred to as parasitic losses), the controller 502 distributes the excess energy in the lighting system 500 through N power dissipation circuits 506.1-506.N, where N is an integer greater than 1. The number of power dissipation circuits 506 and physical disposition is a matter of design choice. The controller 502 distributes the excess energy by generating power dissipation control signals $CPD_1$, $CPD_2$, $CPD_3$, ..., $CPD_N$ to respectively control power dissipation by power dissipation circuits 506.1, 506.2, 506.3, ..., 506.N. The power conversion circuitry 504 can include any type of power converter technology, such as a boost, buck, boost-buck, or Cúk switching power converter.

The controller 502 includes a thermal management strategy module 503 that allows the controller to control the plurality of power dissipation circuits 506.1-506.N in accordance with a thermal management strategy to dissipate the excess energy in the lighting system. The particular thermal management strategy for distributing the excess energy among the power dissipation circuits 506.1-506.N is a matter of design choice.

In at least one embodiment, the thermal management strategy causes the controller 502 to distribute power dissipation in areas of the power conversion circuitry 500 or in other locations of the lighting system 500 where power dissipation circuitry exists, that are cooler, below operational temperature limits, can best tolerate additional power dissipation, and/or will assist in cooling the load (electronic light) 505. Other areas of the lighting system include, for example, an optional power dissipation resistive element 511 located outside of the power conversion circuitry 504.

In at least one embodiment, the thermal management strategy is preset into the controller 502. The manner of presetting the thermal management strategy is a matter of design choice. In at least one embodiment, one or more thermal management strategies are hard-coded into the controller 502 either as software, hardware, or a combination of hardware and software. In at least one embodiment, the thermal management strategy is loaded into the controller 502 as data. In at least one embodiment, the controller 502 includes one or more terminals that receive one time or multiple time programmable bits as the thermal management strategy data that implements the thermal management strategy and/or activates a particular pre-stored thermal management strategy into the controller 502.

For example, in at least one embodiment, the thermal management module 503 includes a memory to store thermal management strategy data used by the controller 502 to provide the thermal management to the lighting system 500. In at least one embodiment, the thermal management strategy data includes code that is executable by an optional processor to carry out the thermal management strategy. In at least one embodiment, the thermal management strategy module 503 is preprogrammed with a thermal management strategy, and the thermal management strategy data configures the thermal management strategy module 503. For example, in at least one embodiment, the thermal management strategy module 503 includes a thermal management strategy of each of a plurality of multiple types of light sources and lamp types. Lamp types can differ by, for example, the type of light source in the lamp, the type of power converter circuitry 504, the number and function of the power dissipation circuits 506.1-506.N, and the physical location of components. In at least one embodiment, the thermal management strategy data identifies a particular lamp type and configures the thermal management strategy module 503 so that the thermal management by the controller is tailored to the particular lamp type.

In at least one embodiment, the thermal management strategy is dynamic and reacts to, for example, particular events such as real-time operational parameter data or actual thermal data that indicates when and, in at least one embodiment, where, power dissipation can be distributed. For example, large phase cut angles of the phase cut input voltage $V_{\phi\_IN}$ decrease the amount of energy provided to the power converter circuitry 504. In at least one embodiment, as the amount of energy provided to the power converter circuitry 504 decreases, a boost switch of the power converter circuitry 504 is used less often and, thus, generates less inherent heat. Accordingly, the controller 502 can proportionately distribute more power dissipation to a power dissipation circuit, such as a subsequently described controlled switch path power dissipation circuit that includes the boost switch. In at least one embodiment, as power demands of a load decrease, the controller 502 can distribute more power to a subsequently described controlled link path power dissipation circuit and/or a controlled flyback path power dissipation circuit.

Additionally, in at least one embodiment, the power conversion circuitry 504 includes thermal sensors 508-511 that provide temperature data to the controller 502. In at least one embodiment, the controller 502 distributes power dissipation to the power dissipation circuits 506.1-506.N that are nearest to cooler areas of the lighting system 500. In at least one embodiment, in addition to providing thermal management through the distribution of power to multiple power dissipation circuits 506.1-506.N, the controller 502 also performs other control functions such as controlling power conversion by the power converter 504.

Additionally, in at least one embodiment, the thermal management strategy distributes power dissipation among the power dissipation circuits 506.1-506.N by rotating power dissipation among the one or groups of the power dissipation circuits 506.1-506.N or controlling any other sequencing strategy among two or more of the N power dissipation circuits 506.1-506.N.

Figure 6:
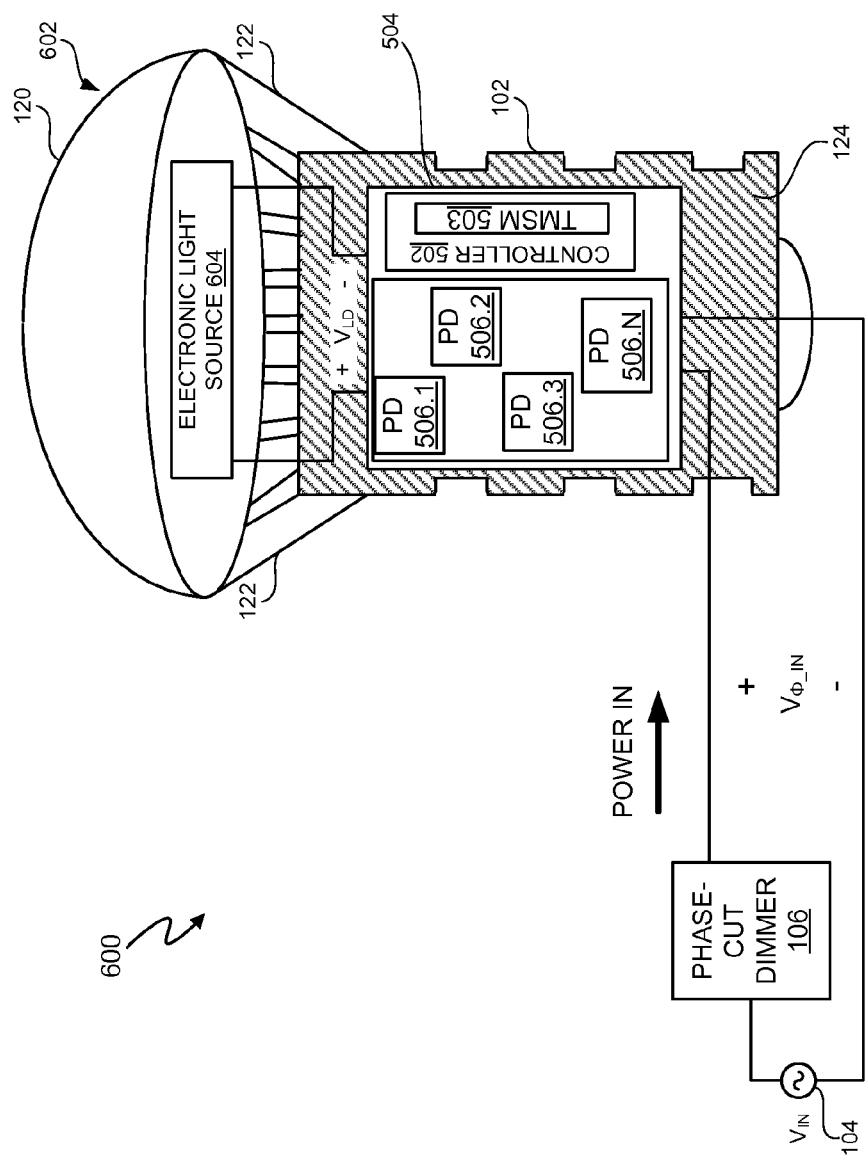
FIG. 6 depicts a lighting system, which represents one embodiment of the lighting system of FIG. 5.

FIG. 6 depicts lighting system 600, which represents one embodiment of lighting system 500. The power converter circuitry 504 and controller 502 are disposed in the housing 102 of the lamp 602 and are configured to convert the input supply voltage $V_{IN}$ into an output voltage $V_{LD}$ for the electronic light source 604. The electronic light source 604 includes one or more LEDs, one or more CFLs, or a combination of one or more LEDs and one or more CFLs. The controller 502 manages power dissipation by the power dissipation circuits 506.1-506.N in accordance with the previously described thermal management strategy.

Figure 7:
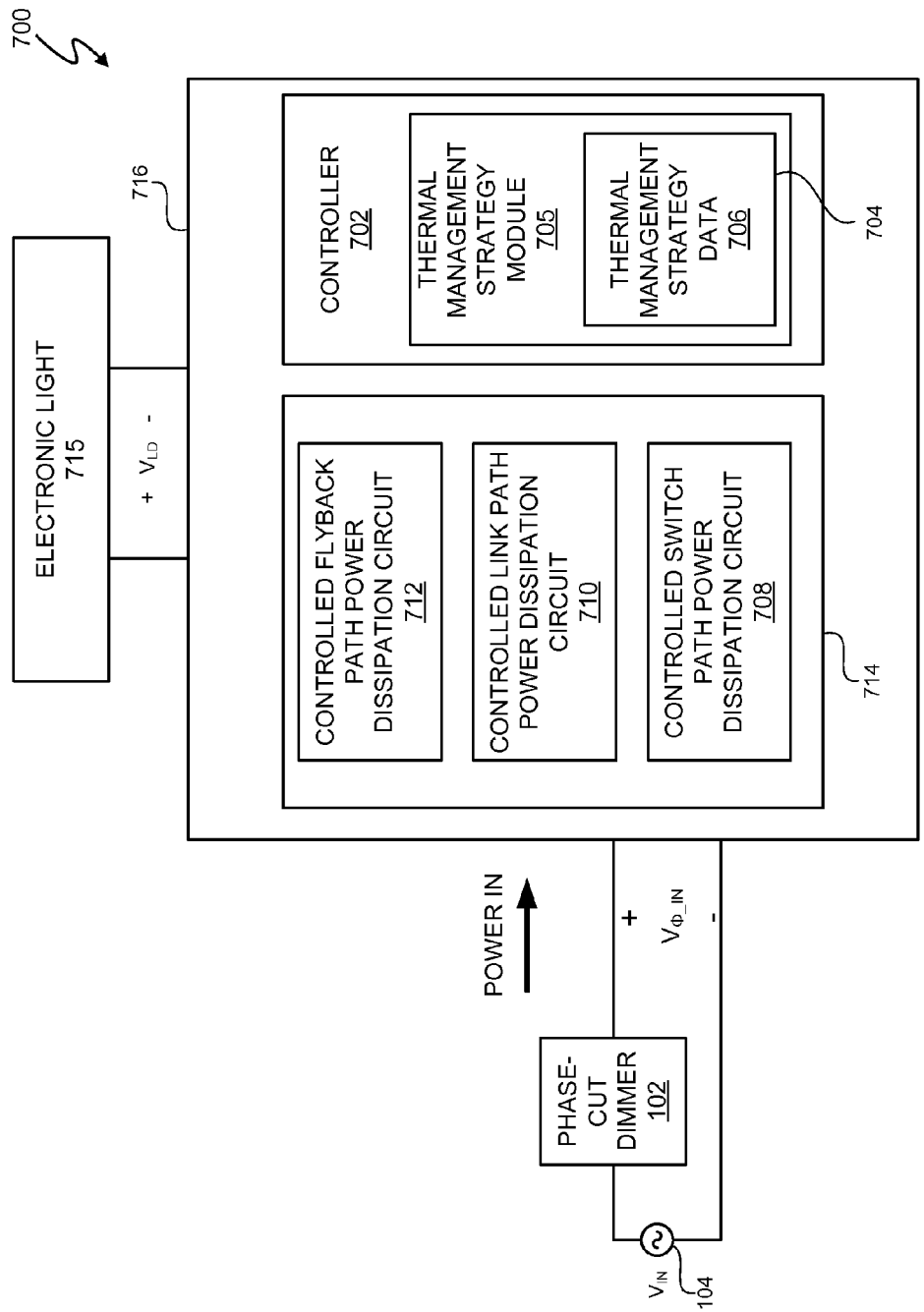
FIG. 7 depicts a lighting system, which represents one embodiment of the lighting system of FIG. 5.

FIG. 7 depicts a lighting system 700 that includes controller 702 to provide thermal management for the lighting system 700. Lighting system 700 represents one embodiment of lighting system 500, and controller 702 represents one embodiment of controller 502. The controller 702 includes a memory 704 to store the thermal management strategy data 706. The thermal management strategy module 705 of the controller 702 utilizes the thermal management strategy data 706 to allow the controller 702 to manage the distribution of power dissipation among the power dissipation circuits 708, 710, and 712 of the power conversion circuitry 714. In at least one embodiment, the thermal management strategy data 706 provides information to the controller 702 to instruct the controller 702 in managing power dissipation distribution among the power dissipation circuits 708, 710, and 712 as described in conjunction with controller 502.

The power dissipation circuits 708, 710, and 712 are a controlled switch path power dissipation circuit 708, a controlled link path power dissipation circuit 710, and a controlled flyback path power dissipation circuit 712. Exemplary implementation and operational descriptions of the power dissipation circuits 708, 710, and 712 are subsequently described. In at least one embodiment, the controller 702 manages power dissipation of the power dissipation circuits 708, 710, and 712 in the same manner as controller 502. Controller 702 also controls conversion of the phase cut input voltage $V_{\phi\_IN}$ and the output voltage $V_{LD}$ for the LEDs 715 by the power conversion circuitry 716.

Referring to FIG. 5, in at least one embodiment, the controller 502 manages the dissipation of excess energy in the lighting systems to prevent a premature disconnection of the phase-cut dimmer. In at least one embodiment, the controller 502 actively controls power dissipation by generating one or more signals to actively and selectively control power dissipation in the lighting system. By actively and selectively controlling power dissipation in the lighting system 500, the controller 502 intentionally manages power dissipation when the power into the lighting system 500 should be greater than the power out to a lamp of the lighting system. However, when the 'power in' can equal the 'power out' plus any inherent power losses without causing the phase-cut dimmer 102 to prematurely disconnect, the controller 502 causes the lighting system 500 to operate more efficiently by reducing or eliminating intentional power dissipation in the lighting system 500.

To control dissipation of the excess energy, the controller 502 controls one or more power dissipation circuits in accordance with the thermal management strategy during one or more controlled power dissipation phases. In at least one embodiment, the controller 502 creates one or more intermixed and/or interspersed power dissipation phases with one or more switching power converter charging and/or flyback phases. "Intermixed" refers to mixing one or more power dissipation phases with one or more charging and/or flyback phases. "Interspersed" refers to inserting one or more power dissipation phases between one or more charging and/or flyback phases. The controlled power dissipation phase occurs after a charging phase begins and before an end of a subsequent flyback phase of the switching power converter. In at least one embodiment, for a boost switching power converter, the charging phase is a phase when an inductor current of the switching power converter is increasing and charging a boost inductor of the switching power converter. The flyback phase is when the inductor current decreases and boosts a link voltage of the switching power converter.

In at least one embodiment, the lighting system 500 includes one, some, or all of a switch path, link path, and flyback path power dissipation circuits to actively and selectively control power dissipation of excess energy in a switching power converter of the lighting system 500. The switch path power dissipation circuit dissipates power through a switch path in the switching power converter of the lighting system 500. In at least one embodiment, the controller 502 is configured to control a boost switch in a switching power converter of a phase cut compatible, dimmable lighting system. The controller 502 is configured to control the boost switch in an efficient mode and a power dissipation mode. In the efficient mode, the controller 502 is configured to operate the boost switch to minimize power dissipation in the boost switch, and in the power dissipation mode the controller is configured to operate the boost switch to increase dissipation of energy in the boost switch relative to any power dissipation in the boost switch during operation in the efficient mode. In at least one embodiment, the switch path includes a current source to limit an inductor current through the boost switch. Limiting the inductor current through the boost switch causes the current source and/or the boost switch to dissipate power.

In at least one embodiment, the controller 502 controls one or more of the timing, sequencing, and/or magnitude of the current through the boost switch, or any combination thereof, to control power dissipation by the lighting system 500. In at least one embodiment, controlling the timing of the current refers to a duration of time in which the current is limited or restricted. In at least one embodiment, controlling the sequencing of the current through the boost switch refers to selecting which charging and flyback phase time frames and/or cycles of an input voltage to a switching power converter to control power dissipation in the lighting system. In at least one embodiment, each charging and flyback time frame occurs between when a first charging phase following an immediately preceding flyback phase begins and a flyback phase immediately preceding a next charging phase ends. In at least one embodiment, the sequence of cycles is a consecutive series of cycles, and, in at least one embodiment, the sequence of time frames or cycles is a non-consecutive series of time frames or cycles. In at least one embodiment, controlling the magnitude of the current includes controlling the internal resistance of the boost switch and/or controlling one or more current limits on the current through the boost switch.

The flyback path power dissipation circuit dissipates power through a flyback path of the switching power converter. In at least one embodiment, the lighting system controls power dissipation through a flyback path by controlling a transformer primary current in the flyback path and, for example, limiting the primary current with a current source and dissipating power in the current source. In at least one embodiment, the flyback path power dissipation circuit includes a flyback switch to limit the flyback current in the flyback switch. In at least one embodiment, the flyback path includes a current source to limit the flyback current. Limiting the flyback current through the flyback switch causes the current source and/or the flyback switch to dissipate power. In at least one embodiment, the lighting system controls one or more of the timing, sequencing, and/or magnitude of the current through the flyback switch, or any combination thereof, to control power dissipation by the lighting system.

The link path power dissipation circuit dissipates power through a link path of the switching power converter by controlling a link current of the switching power converter. In at least one embodiment, the controller controls the link path power dissipation circuit to limit the link current with a current source and dissipating power in the current source. In at least one embodiment, the link path power dissipation circuit includes an output switch to limit the link current by controlling an internal resistance of the switch. In at least one embodiment, the link path includes a current source to limit the link current. Limiting the link current through the output switch causes the current source and/or the output switch to dissipate power. In at least one embodiment, the lighting system controls one or more of the timing, sequencing, and/or magnitude of the current through the output switch, or any combination thereof, to control power dissipation by the lighting system.

The following description describes exemplary implementations and control of various power dissipation circuits. The controller 808 (which is one embodiment of the controller 502) in subsequent described Figures coordinates control of the power dissipation circuits in accordance with a thermal management strategy implemented by the thermal management strategy module 807. The thermal management strategy module 807 represents one embodiment of the thermal management strategy module 503.

Figure 8:
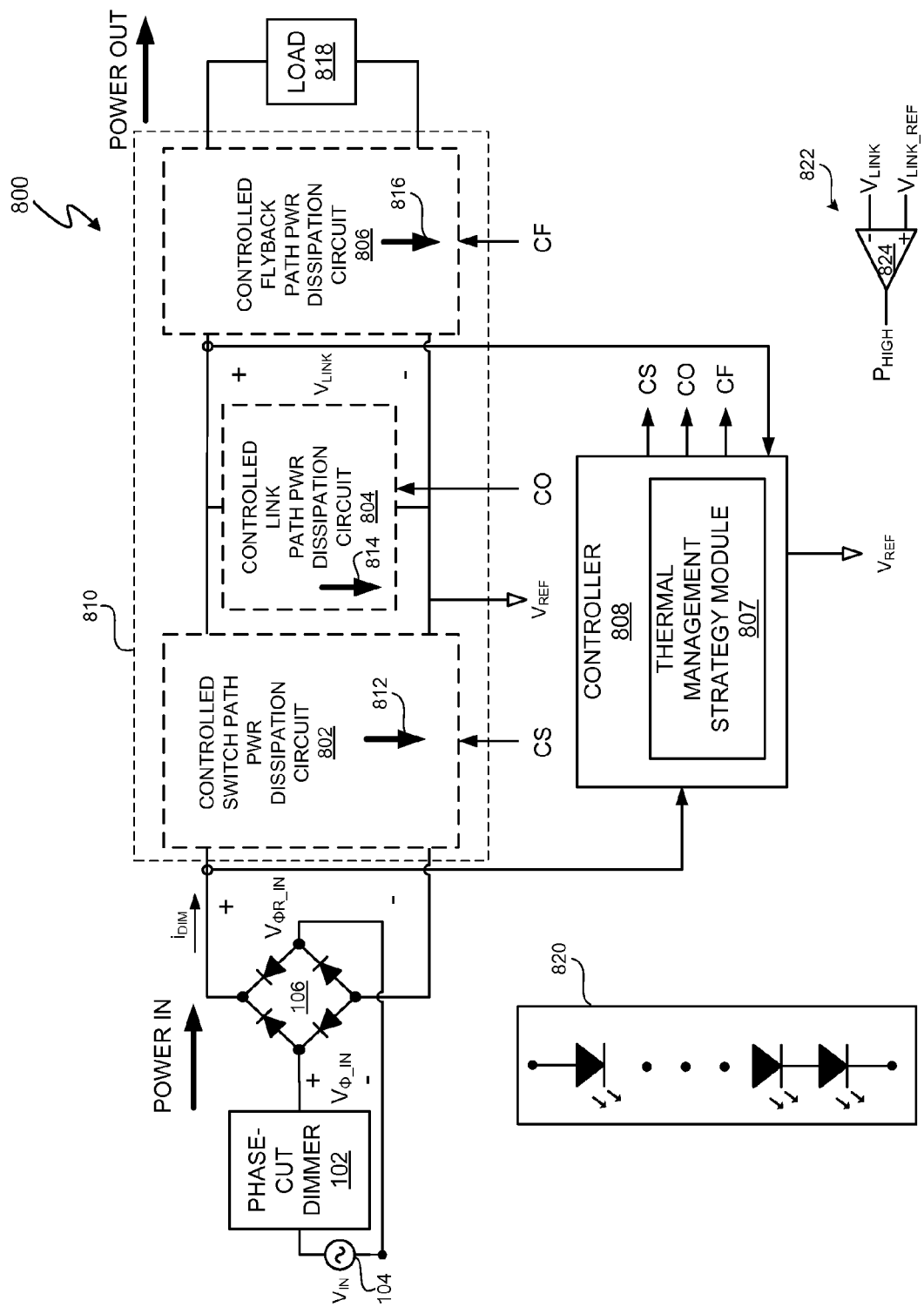
FIG. 8 depicts a lighting system that includes at least one or more power dissipation circuits.

FIG. 8 depicts a lighting system 800 that includes at least one, some, or all of a controlled switch path power dissipation circuit 802, a controlled link path power dissipation circuit 804, a controlled flyback path power dissipation circuit 806, and a controller 808 to actively and selectively control power dissipation in a switching power converter 810 of the lighting system 800 in accordance with a thermal management strategy implemented by the thermal management strategy module 503. Controller 808 represents one embodiment of controller 502. The power dissipation circuits 802, 804, and 806 are shown in dotted lines because one or two of the power dissipation circuits 802, 804, and 806 are optional. Whether to include one, two, or three of the power dissipation circuits 802, 804, and 806 and which power dissipation circuit(s) to include in lighting system 800 is a matter of design choice. Including two or three of the power dissipation circuits 802, 804, and 806 allows for distribution of power dissipation among the included power dissipation circuits. In at least one embodiment, power distribution is actively controlled by controller 808. In at least one embodiment, power distribution is fixed or pre-programmed. However, including more than one of the power distribution circuits 802, 804, and 806 can increase the complexity and cost of the switching power converter 810 and/or the complexity and cost of the controller 808. Additionally, although the power dissipation circuits 802, 804, and 806 are shown as part of the switching power converter 810, in at least one embodiment, all or part of the dissipation circuits 802, 804, and 806 are located in controller 808.

As previously described, the phase-cut dimmer 102 can phase cut an input voltage $V_{IN}$ supplied by voltage supply 104. The full-bridge diode rectifier 106 rectifies the phase cut input voltage $V_{\phi\_IN}$ to generate a rectified input voltage $V_{\phi R\_IN}$. In some circumstances, especially at lower power output levels, to maintain the dimmer current $i_{DIM}$ above a hold current value the switching power converter 810 draws more POWER IN from the voltage supply 104 than the $P_{INH}$ plus the POWER OUT of the switching power converter 810. Assuming the inherent losses of the switching power converter 810 are insufficient to dissipate enough power equal to a difference between the POWER IN and the POWER OUT+$P_{INH}$, the lighting system 800 controls one or more of the power dissipation circuits 802, 804, and 806 so that the POWER IN equals POWER OUT+$P_{INH}$ plus power dissipated by one or more of the power dissipation circuits 802, 804, and/or 806. The switching power converter 810 provides power to load 818. In at least one embodiment, load 818 includes one or more light emitting diodes (LEDs), such as the series connected string of N LEDs 820. "N" represents a positive integer.

Controller 808 generates one or more respective control signals for each of the dissipation circuits 802, 804, and 806 that are included in the lighting system 800. Control signals CS, CO, and CF respectively control power dissipation in the switch path power dissipation circuit 802, link path power dissipation circuit 804, and flyback path power dissipation circuit 806. The switch path power dissipation circuit 802 dissipates power through a switch path 812 in the switching power converter 810 of the lighting system 800 in accordance with the control signal CS. The link path power dissipation circuit 804 dissipates power through a link path 814 in the switching power converter 810 in accordance with the control signal CO. The flyback path power dissipation circuit 806 dissipates power through a flyback path 816 in the switching power converter 810 in accordance with the control signal CF. The particular method and circuit(s) used to implement the power dissipation circuits 802, 804, and 806 and control dissipation of power through the switch path 812 is a matter of design choice. Additionally, controlling the timing, sequencing, and/or magnitude of power dissipation in the power dissipation circuits 802, 804, and 806 is a matter of design choice. Exemplary embodiments of the power dissipation circuits 802, 804, and 806 are subsequently described. The power dissipation circuits 802, 804, and 806 are depicted in FIG. 8 as wholly outside the controller 808. However, in at least one embodiment, all or part of one or more of the power dissipation circuits 802, 804, and 806 are included within the controller 808.

The particular implementation of controller 808 is a matter of design choice. For example, controller 808 can be (i) implemented as an integrated circuit including, for example, a processor to execute software or firmware instructions stored in a memory, (ii) implemented using discrete components, or (iii) implemented using any combination of the foregoing. In at least one embodiment, controller 808 generally regulates the link voltage as described in U.S. patent application Ser. No. 11/967,269, entitled "Power Control System Using a Nonlinear Delta-Sigma Modulator With Nonlinear Power Conversion Process Modeling", filed on Dec. 31, 2007, inventor John L. Melanson (referred to herein as "Melanson I"), U.S. patent application Ser. No. 11/967,275, entitled "Programmable Power Control System", filed on Dec. 31, 2007, and inventor John L. Melanson (referred to herein as "Melanson II"), U.S. patent application Ser. No. 12/495,457, entitled "Cascode Configured Switching Using at Least One Low Breakdown Voltage Internal, Integrated Circuit Switch to Control At Least One High Breakdown Voltage External Switch", filed on Jun. 30, 2009 ("referred to herein as "Melanson III"), and inventor John L. Melanson, and U.S. patent application Ser. No. 12/174,404, entitled "Constant Current Controller With Selectable Gain", filing date Jun. 30, 2011, and inventors John L. Melanson, Rahul Singh, and Siddharth Maru, which are all incorporated by reference in their entireties. The switching power converter 810 can be any type of switching power converter, such as a boost, buck, boost-buck, or Cúk switching power converter. Switching power converter 810 includes other components, such as an EMI capacitor, inductor, and link capacitor, which, for clarity of FIG. 8, are not shown but are subsequently described specific embodiments.

The manner of determining whether the POWER IN is greater than the $P_{INH}$+POWER OUT is a matter of design choice. In at least one embodiment, the controller 808 includes the power monitor circuit 822. When power demand by the load 818 increases, the link voltage $V_{LINK}$ decreases, which indicates an increase in the POWER OUT. Conversely, when power demand by the load 818 declines, the link voltage $V_{LINK}$ increases, which indicates a decrease in the POWER OUT. The comparator 824 of the power monitor circuit 822, thus, compares the link voltage $V_{LINK}$ with a reference link voltage $V_{LINK\_REF}$. In at least one embodiment, the reference link voltage $V_{LINK\_REF}$ is set to a voltage level that is a few volts or a few percent higher than the nominal voltage set for the load 818. If the link voltage $V_{LINK}$ decreases below the reference link voltage $V_{LINK\_REF}$, the output $P_{HIGH}$ of the comparator 824 is HIGH, which indicates an increase in the POWER OUT. If the link voltage $V_{LINK}$ increases above the reference link voltage $V_{LINK\_REF}$, the output $P_{HIGH}$ of the comparator 824 is LOW, which indicates a decrease in the POWER OUT. In at least one embodiment, if normal operation of the switching power converter 810 does not prevent an increase of the link voltage $V_{LINK}$ above the reference link voltage $V_{LINK\_REF}$, then the POWER IN is greater than the POWER OUT+$P_{INH}$, and controller 808 operates one or more of the power dissipation circuits 812, 814, and 816 to dissipate the excess energy represented by the difference between the POWER IN and the POWER OUT+$P_{INH}$.

Figure 9:
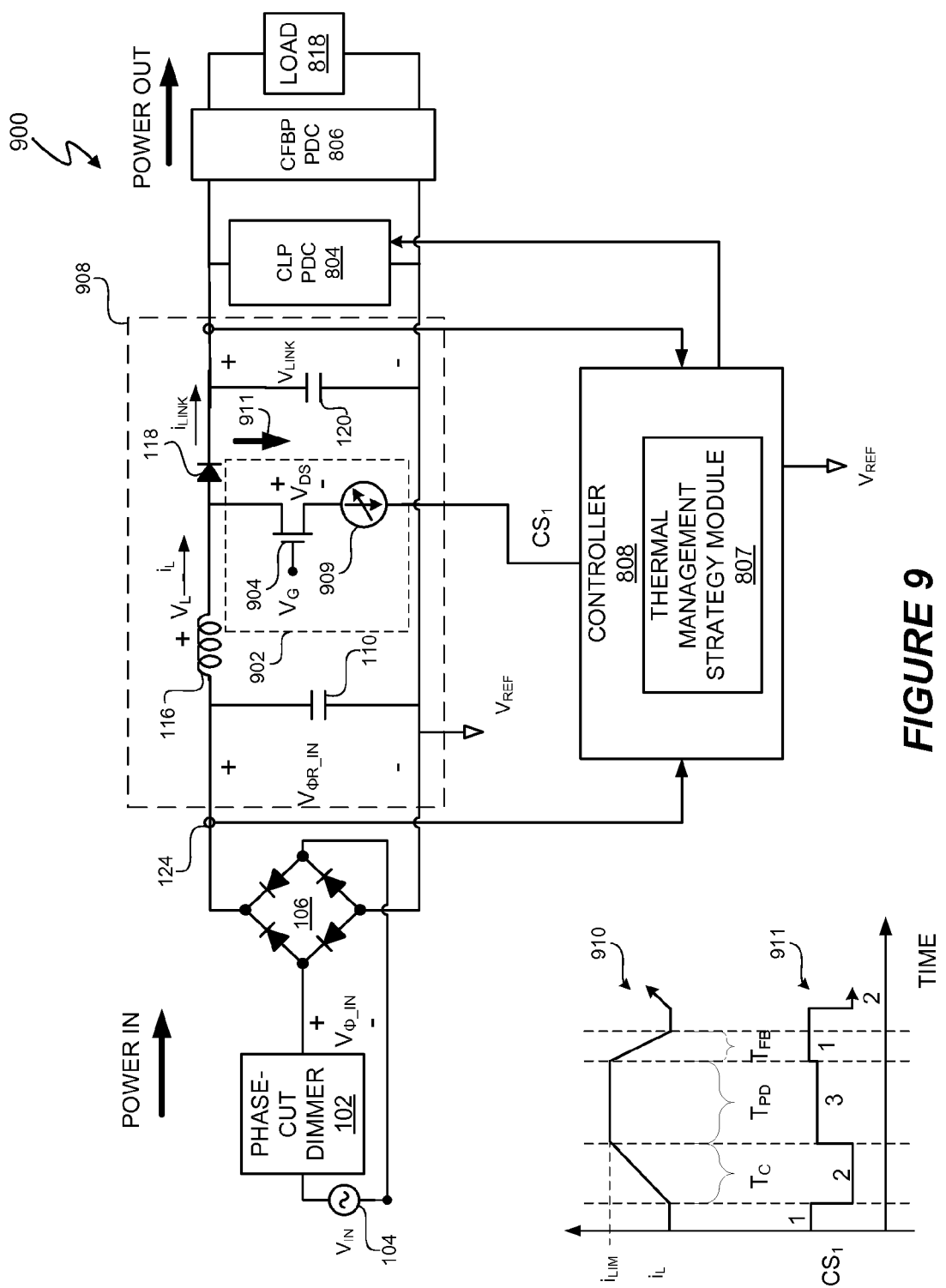
FIG. 9 depicts a lighting system that includes a switch path power dissipation circuit.

FIG. 9 depicts a lighting system 900 that represents one embodiment of lighting system 800. Lighting system 900 includes a switch path power dissipation circuit 902 to dissipate excess power in the lighting system 900. The switch path power dissipation circuit 902 represents one embodiment of the switch path power dissipation circuit 802. The particular implementation and control of the switch path power dissipation circuit 902 is a matter of design choice. The switch path power dissipation circuit 902 includes a FET boost switch 904 in a boost-type switching power converter 908 and includes a controllable current source 910. In at least one embodiment, the controller 808 actively dissipates power in the switching power converter 908 during a power dissipation phase by limiting an inductor current $i_L$ and thereby actively and selectively dissipates power in the lighting system 900. Limiting the inductor current $i_L$ through the boost switch 904 causes the current source 910 and/or the boost switch 904 to dissipate the excess power through switch path 911.

When the POWER IN is greater than the $P_{INH}$+POWER OUT to the load 918, the controller 808 controls the switch path power dissipation circuit 902 to control dissipation of the excess energy by at least the boost switch 904. In at least one embodiment, a gate voltage $V_G$ biases a gate of boost switch 904 so that controller 808 controls conductivity of the boost switch 904 using a source control signal $CS_1$ as, for example, generally described in Melanson III. In other embodiments, controller 808 controls the gate voltage $V_G$ of boost switch 904 to control conductivity of the boost switch 904 as, for example, generally described in Melanson I and Melanson II. Controller 808 represents one embodiment of controller 808. In at least one embodiment, the control signal $CS_1$ controls the value of the inductor current $i_L$, as depicted by the exemplary, variable inductor current waveform 910.

The inductor current waveform 910 represents an exemplary inductor current $i_L$ waveform during controlled dissipation of energy through the boost switch 904. During a charging phase $T_C$, the controller 808 generates the control signal $CS_1$ to cause the boost switch 904 to conduct. When the boost switch 904 conducts, the inductor current $i_L$ increases. When POWER IN is greater than POWER OUT+$P_{INH}$, rather than minimizing power loss, the controller 808 intentionally limits the inductor current $i_L$, which causes dissipation of excess energy by at least the boost switch 904 during a power dissipation phase $T_{PD}$. Assuming that inherent losses in the switching power converter 908 are negligible, the "excess energy" equals the POWER IN minus the (POWER OUT+$P_{INH}$). Limiting the inductor current $i_L$ during the power dissipation phase $T_{PD}$ causes the change in the inductor current $di_L/dt$ to move toward 0. Since the voltage $V_L$ across the inductor 116 equals $L \cdot di_L/dt$, the voltage $V_L$ is directly proportional to the rate of change of the inductor current $di_L/dt$. "L" is the inductance of inductor 116. Thus, as the rate of change of the inductor current $di_L/dt$ moves toward 0, the rate of energy storage by the inductor 116 decreases toward 0 and more power is dissipated by the boost switch power dissipation circuit 902.

Figure 1:
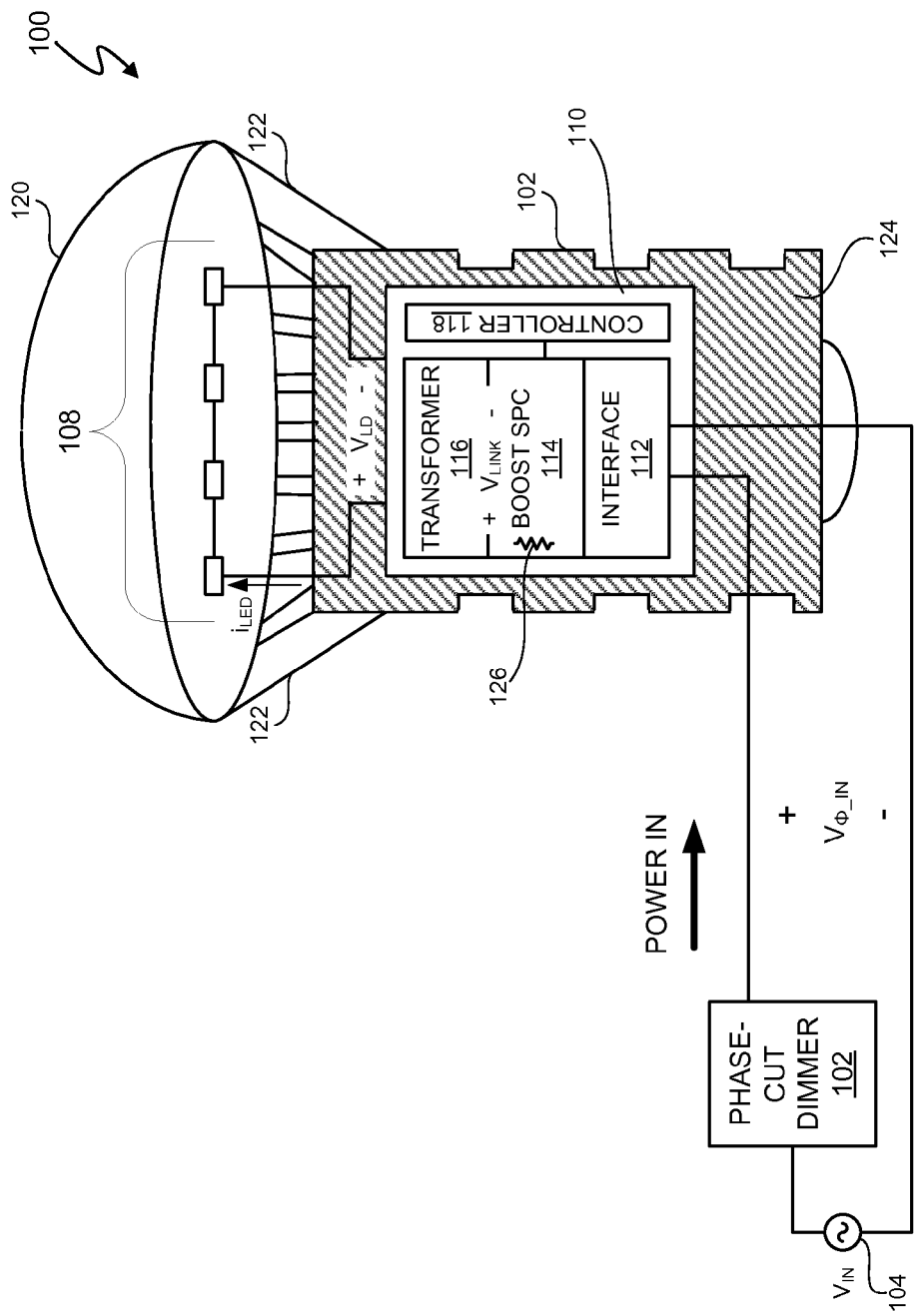
FIG. 1 (labeled prior art) depicts a lighting system with an LED-based lamp.
Figure 2:
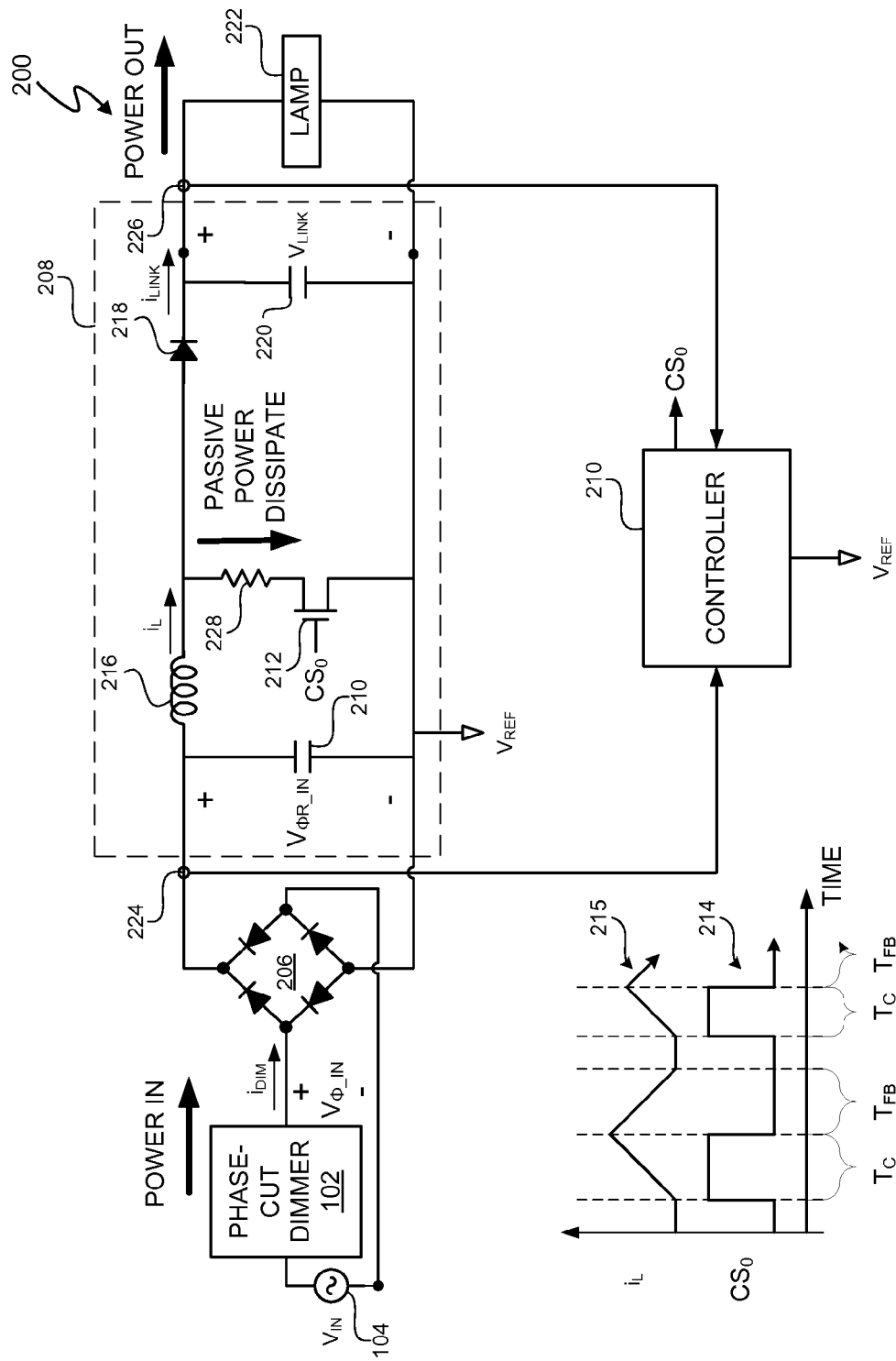
FIG. 2 (labeled prior art) depicts a lighting system that includes a leading edge dimmer.
Figure 3:
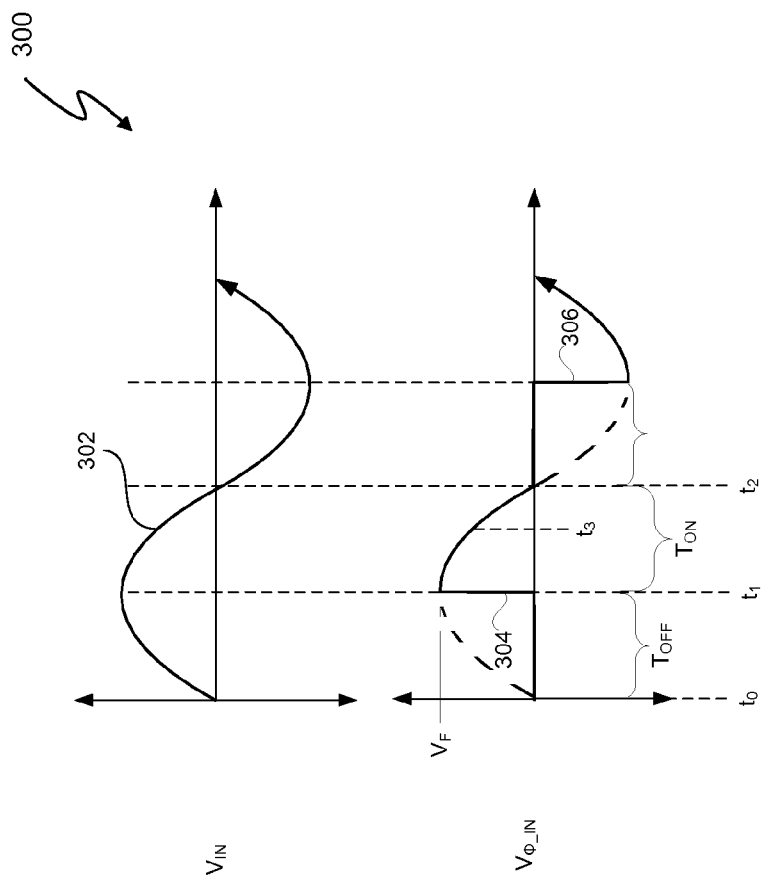
FIG. 3 (labeled prior art) depicts exemplary voltage graphs associated with the lighting system of FIG. 2.
Figure 4:
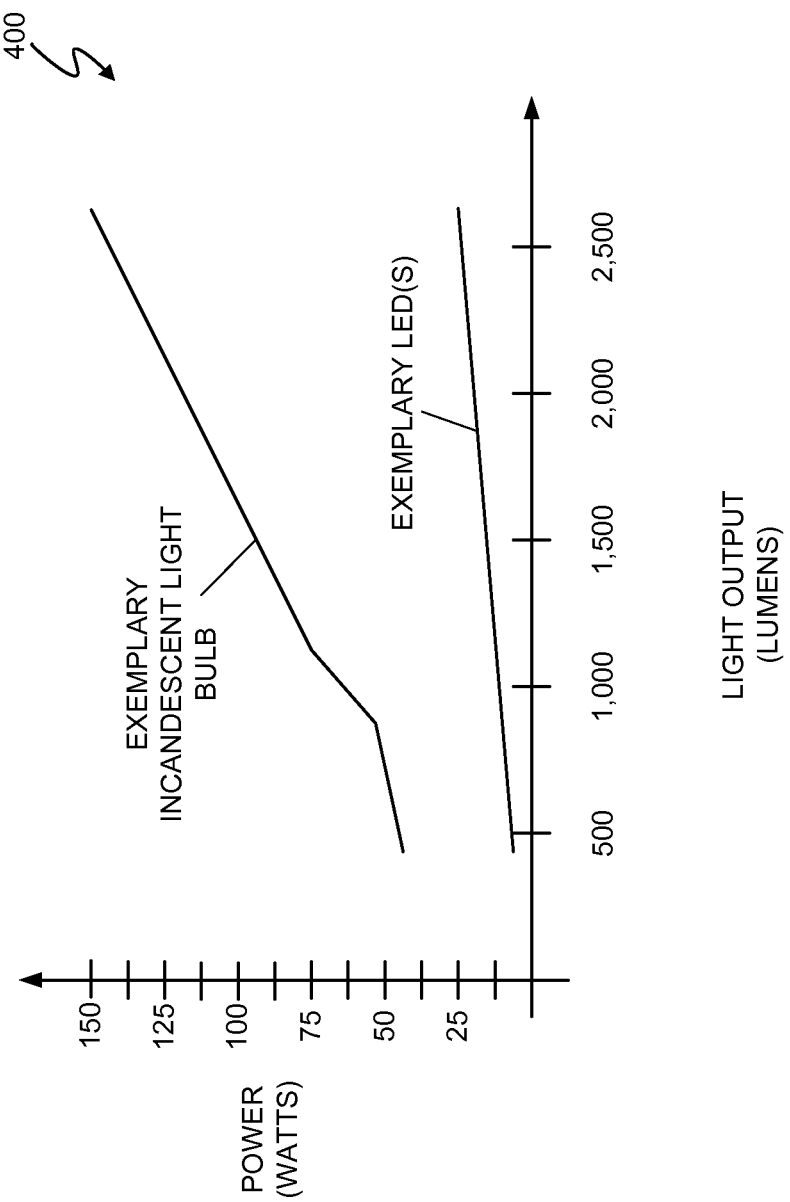
FIG. 4 (labeled prior art) depicts power versus light output for exemplary incandescent bulbs and light emitting diodes.

Referring to the control signal $CS_1$ waveform 911, in at least one embodiment, the controller 808 is configured to control the boost switch 904 in an efficient mode and a power dissipation mode. In the efficient mode, the controller 808 generates a two-state control signal $CS_1$, such as the two-states of control signal $CS_0$ (FIG. 1), to operate the boost switch 904 to minimize power dissipation in the boost switch 904. In the power dissipation mode, the controller 808 is configured to operate the boost switch 904 to increase dissipation of energy in the boost switch relative to any power dissipation in the boost switch 904 during operation in the efficient mode. In at least one embodiment, to operate the boost switch 904 in the power dissipation mode, the controller 808 generates the control signal $CS_1$ with at least three (3) states, such as states "1", "2", and "3" in the waveform 911. During states 1 and 2, the controller 808 operates the boost switch 904 in an efficient mode to minimize power dissipation by the boost switch 904. During state 3, the controller 808 operates the boost switch 904 in a power dissipation mode. In state 3, the controller 808 limits the inductor current $i_L$ and causes the control signal $CS_1$ to have a voltage that is greater than state "2" but lower than state "1". Thus, the boost switch 904 does not turn OFF completely in state 3. State 3 is not simply a transient state, i.e. a continuous transition of control signal $CS_1$ between states 1 and 2. State 3 is an intentional, non-transient state that alters power dissipation by the boost switch 904. Thus, in state 3, the controller 808 generates the control signal $CS_1$ by limiting the inductor current $i_L$ to cause a non-zero voltage $V_{DS}$ across the boost switch 904 at the same time that current $i_L$ flows through the boost switch 904. The simultaneous occurrence of the voltage $V_{DS}$ across the boost switch 904 and the current $i_L$ through the boost switch 904 causes power dissipation by the boost switch 904. The number of states is a matter of design choice and can be increased or decreased by, for example, controlling different limits of the inductor current $i_L$.

For example, in at least one embodiment, the rate of change of the inductor current $di_L/dt$ is driven by the controller 808 to approximately 0. When the change $di_L/dt$ in the inductor current $i_L$ is 0, the inductor current $i_L$ holds at a constant value, and the voltage $V_L$ across inductor 116 is approximately 0. During a charging phase, the inductor current $i_L$ increases. To dissipate power during a charging phase $T_C$, the rate of change of the inductor current $di_L/dt$ is decreased, which reduces the voltage $V_L$ across the inductor 116. As the inductor voltage $V_L$ decreases, the proportion of power dissipated by the switch path power dissipation circuit 902 increases. During a flyback phase, the rate of change of the inductor current $di_L/dt$ and the inductor voltage $V_L$ are negative. Thus, to dissipate power during a flyback phase, the rate of change of the inductor current $di_L/dt$ is increased towards 0, which increases the inductor voltage $V_L$ toward 0 and increases the proportion of power dissipated by the switch path power dissipation circuit 902.

In at least one embodiment, the current source 910 limits the inductor current to an inductor current limit value $i_{LIM}$. Thus, when a value of the inductor current $i_L$ through the boost switch 904 reaches the inductor current limit value $i_{LIM}$, $di_L/dt$ decreases with 0 or to a smaller value that a value that would otherwise occur without a power dissipation phase $T_{PD}$. In at least one embodiment, the controller 808 intersperses the power dissipation phase $T_{PD}$ between the charging phase $T_C$ and the flyback phase $T_{FB}$ and causes the switch path power dissipation circuit 902 to dissipate energy until the flyback period $T_{FB}$ begins when the boost switch 904 is turned OFF.

In at least one embodiment, the inductor current limit value $i_{LIM}$ is controllable by the controller 808 to adjust a duration of the power dissipation period $T_{PD}$. In at least one embodiment, the source control signal $CS_1$ controls when the charging phase $T_C$ and the flyback phase $T_{FB}$ begin for each cycle of the rectified input voltage $V_{\phi R\_IN}$. In at least one embodiment, the power dissipation phase $T_{PD}$ ends when the flyback phase $T_{FB}$ begins. Thus, since controller 808 generates the source control signal $CS_1$, controller 808 controls the duration of the power dissipation phase $T_{PD}$ by controlling when to begin the flyback phase $T_{FB}$.

The controller 808 controls interspersing and/or intermixing of one or more power dissipation phases with one or more charging and/or flyback phases. In at least one embodiment, the controller 808 intersperses a power dissipation phase $T_{PD}$ between charging phases or a flyback phase by reducing the change in the inductor current $i_L$ over time, i.e. $di_L/dt$, by reducing $di_L/dt$ to zero. When $di_L/dt$ is reduced to zero, power dissipation occurs through the boost switch 904. In at least one embodiment, the controller intermixes a power dissipation phase $T_{PD}$ with a charging phase $T_C$ or a flyback phase $T_{FB}$ by reducing $di_L/dt$ to a non-zero value. When $di_L/dt$ is reduced to a non-zero value, the charging phase $T_C$ or flyback phase $T_{FB}$ continues in combination with power dissipation by the switch path power dissipation circuit 902 through the boost switch 904.

Figure 10:
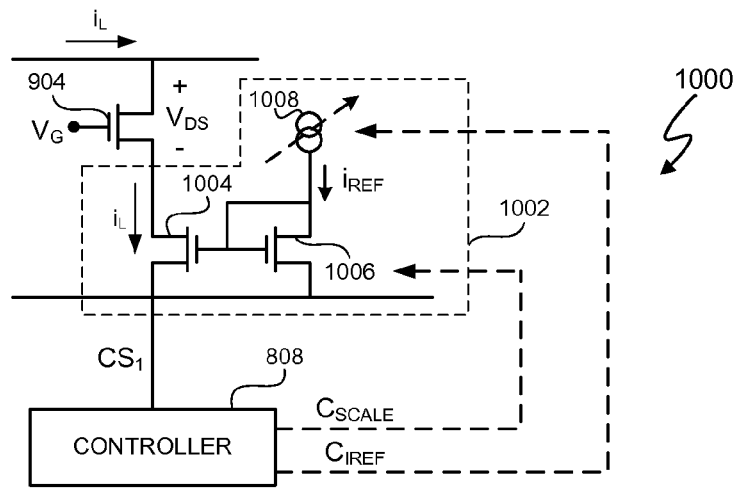
FIG. 10 depicts an embodiment of the switch path power dissipation circuit of FIG. 9.
Figure 11:
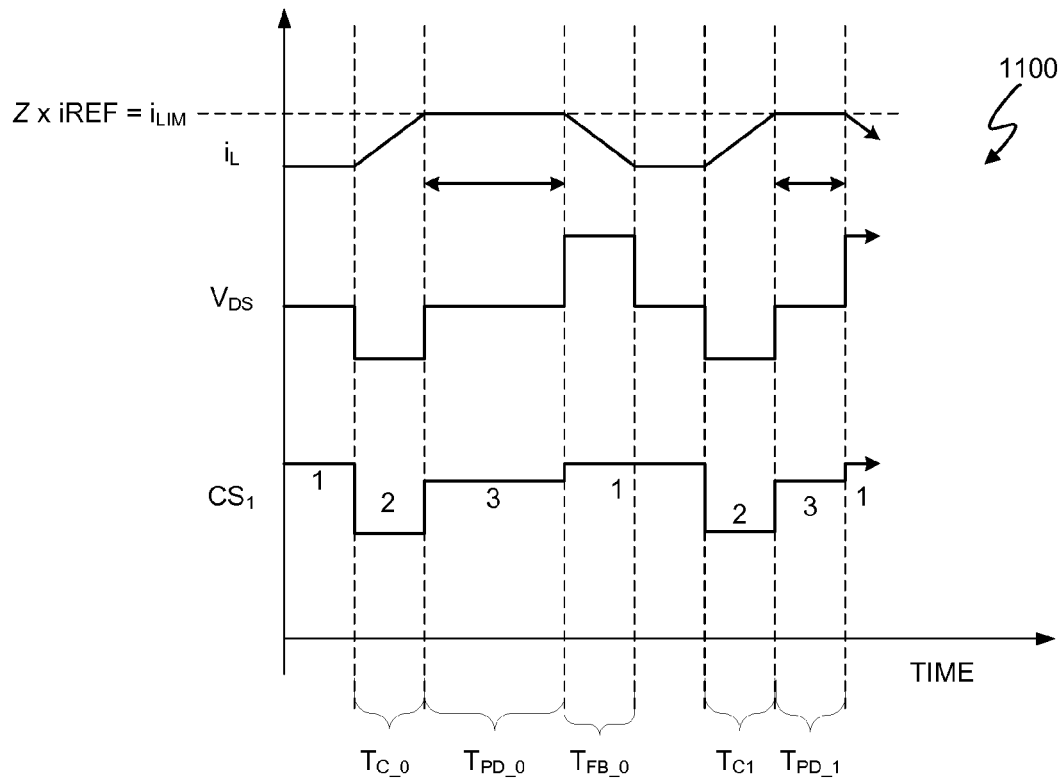
FIGS. 11 and 12 depict exemplary waveforms present during an exemplary operation of the switch power dissipation circuit of FIG. 10.

FIG. 10 depicts a switch path power dissipation circuit 1000, which represents one embodiment of the switch path power dissipation circuit 902. FIG. 11 depicts exemplary waveforms 1100 for an exemplary inductor current $i_L$, boost switch 904 drain-to-source voltage $V_{DS}$, and control signal $CS_1$ present during an exemplary operation of the switch power dissipation circuit 1000. Referring to FIGS. 9, 10, and 11, the switch path power dissipation circuit 1000 includes a controllable current source 1002, which represents one embodiment of the controllable current source 910. The current source 1002 includes FETs 1004 and 1006, which are configured as a current mirror. In at least one embodiment, the controller 808 modulates the control signal $CS_1$ to control current through switch 904 using at least three (3) states. States 1 and 2 are efficient states when power dissipation by the boost switch 904 is minimized. State 3 is an inefficient or power dissipation state when controller 808 intentionally and actively causes the boost switch 904 to dissipate power.

When controller 808 causes the source control signal $CS_1$ to become a logical 0, the boost switch 904 turns ON, and the inductor current $i_L$ begins to ramp up at the beginning of charging period $T_{C\_0}$. When the inductor current $i_L$ is ramping up, the control signal $CS_1$ is in state 2, which allows the boost switch 904 to operate efficiently, i.e. minimize internal power loss by the boost switch 904. In at least one embodiment, the boost switch 904 turns ON at state 2, and the inductor $i_L$ flows through boost switch 904 and FET 1004. Current source 1008 supplies a reference current $i_{REF}$, which flows through FET 1006. In at least one embodiment, control signal $CS_1$ turns boost switch 904 ON in state 2 with sufficient voltage to minimize the internal resistance of boost switch 904. The size of FET 1004 is scaled to the size of FET 1006 by a scaling factor of Z. The value of the scaling factor Z is a positive number and a matter of design choice. The value of the scaling factor Z times the value of the reference current $i_{REF}$ sets an inductor current limit value $i_{LIM}$. Thus, when the inductor current $i_L$ reaches the inductor current limit value $i_{LIM}$, the inductor current $i_L$ will stop increasing. In at least one embodiment, when the inductor current $i_L$ reaches the inductor current limit value $i_{LIM}$, the charging phase $T_{C\_0}$ ends and a power dissipation phase $T_{PD\_0}$ begins. At the current limit $i_{LIM}$, the control signal $CS_1$ is at the non-transient state 3, and power is dissipated by the switch 904. Once the inductor current $i_L$ reaches the current limit value $i_{LIM}$, the inductor current $i_L$ becomes a constant equal to $i_{LIM}$, and boost switch 904 and FET 1004 dissipate the excess energy in the switching power converter 908.

When the boost switch 904 turns OFF, the power dissipation phase $T_{PD\_0}$ ends, and the flyback phase $T_{FB\_0}$ begins. In discontinuous conduction mode (DCM) and critical conduction mode (CRM), the flyback phase $T_{FB\_0}$ continues until the inductor current $i_L$ reaches zero. In continuous conduction mode (CCM), the next charging phase $T_{C\_1}$ begins prior to the inductor current $i_L$ reaching zero. The waveforms 1100 illustrate the switching power converter 908 operating in DCM. The switching power converter 908 can also operate in CCM and CRM. In at least one embodiment, when operating in DCM, once the link voltage $V_L$ drops to a predetermined value, the controller 808 generates control signal $CS_1$ to cause the boost switch 904 to conduct and initiate the next charging phase $T_{C\_1}$. When the inductor current $i_L$ reaches the inductor current limit value $i_{LIM}$, the next power dissipation phase $T_{PD\_1}$ begins and so on.

The duration of the power dissipation phases $T_{PD\_0}$, $T_{PD\_1}$, and so on is controlled by the controller 808 and are a matter of design choice. In at least one embodiment, the duration of the power dissipation phases is sufficient to dissipate all excess energy in a single cycle of the rectified input voltage $V_{\phi R\_IN}$. In at least one embodiment, the duration of the power dissipation phases is varied and sequenced to dissipate all excess energy in consecutive or non-consecutive cycles of the rectified input voltage $V_{\phi R\_IN}$.

Additionally, in at least one embodiment, current source 1008 can vary the value of the reference current $i_{REF}$ in accordance with an optional current reference control signal $C_{iREF}$ generated by controller 808. Varying the value of the reference current $i_{REF}$ also varies the inductor limit current $i_{LIM}$ in accordance with the scaling factor Z. By varying the reference current $i_{REF}$ and, thus, the inductor limit current $i_{LIM}$ during a single cycle of the rectified input voltage $V_{\phi R\_IN}$, the controller 808 can stage power dissipation. The controller 806 can also vary the inductor limit current $i_{LIM}$ during consecutive or non-consecutive cycles of rectified input voltage $V_{\phi R\_IN}$ to manage power dissipation in switching power converter 908.

Additionally, in at least one embodiment, current source 1008 can vary the value of the scaling factor Z in accordance with an optional scaling factor control signal $C_{SCALE}$ generated by controller 808. Varying the scaling factor Z also varies the inductor limit current $i_{LIM}$ in accordance with the scaling factor Z. By varying the scaling factor Z and, thus, the inductor limit current $i_{LIM}$ during a single cycle of the rectified input voltage $V_{\phi R\_IN}$, the controller 808 can stage power dissipation. The controller 806 can also vary the inductor limit current $i_{LIM}$ during consecutive or non-consecutive cycles of rectified input voltage $V_{\phi R\_IN}$ to manage power dissipation in switching power converter 908. In at least one embodiment, the FETs 1004 and/or 1006 are implemented using multiple, parallel connected FETs (not shown). In at least one embodiment, the scaling factor control signal $C_{SCALE}$ changes the number of FETs used to implement FETs 1004 and/or 1006 and, thus, changes the scaling factor. For example, in at least one embodiment, one FET is used to implement FET 1006 and 200 FETs identical to the one FET used to implement FET 1006 are used to implement FET 1004, which provides a scaling factor of 200. By disabling one or more of the FETs used to implement FET 1004, the controller varies the scaling factor Z. Additionally, in at least one embodiment, the controller 808 controls both the reference current $i_{REF}$ and the scaling factor $C_{SCALE}$ to control the inductor current $i_L$.

Figure 12:
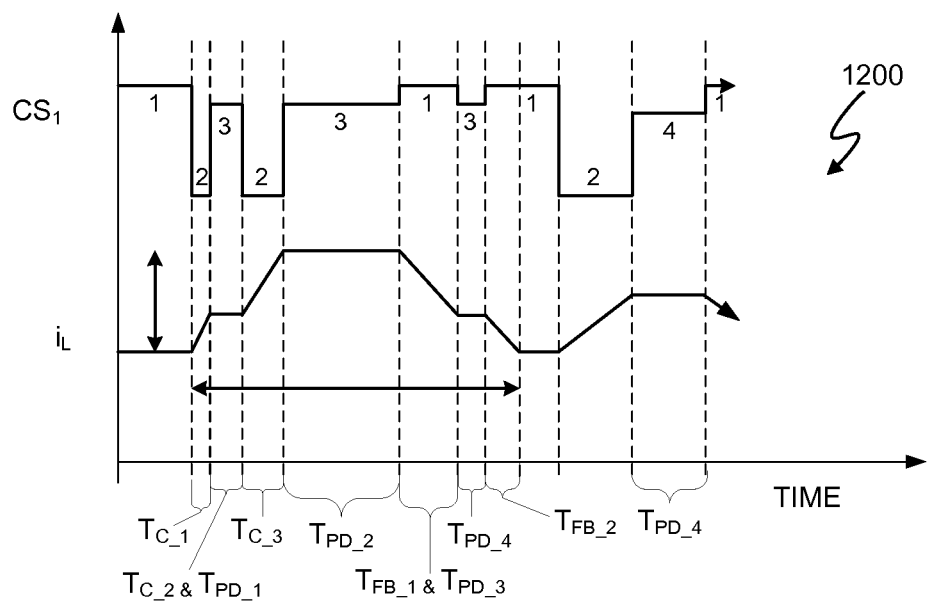

FIG. 12 depicts an exemplary inductor current $i_L$ and control signal $CS_1$ waveforms 1200 for when the controller 808 causes the switch path power dissipation circuit 902 to dissipate excess power. Referring to FIGS. 9, 10, and 12, charging phases and feedback phases can be interspersed and intermixed with power dissipation phases as desired to control the timing, sequencing, and magnitude of power dissipation in the boost switch 904. The particular timing and amount of intermixing and interspersing power dissipation in the switch path power dissipation circuit 1000 is a matter of design choice. The waveforms 800 represent an exemplary choice.

In at least one embodiment, the controller 808 modulates the control signal $CS_1$ to control current through switch 904 using at least four (4) states. States 1 and 2 are efficient states when the controller 808 operates the boost switch 904 in an efficient mode and, thus, minimizes power dissipation by the boost switch 904. States 3 and 4 are inefficient states when the controller 808 operates the boost switch 904 in a power dissipation mode. During states 3 and 4 in the power dissipation mode, the controller 808 intentionally and actively causes the boost switch 904 to dissipate power.

Referring to the waveforms 800 and the switch path power dissipation circuit 1000, during the charging phase $T_{C\_1}$, the control signal $CS_1$ causes the boost switch 904 to saturate and the inductor current $i_L$ increases over time. At the beginning of the intermixed charging phase $T_{C\_2}$ and power dissipation phase $T_{PD\_1}$, the controller 808 generates the current reference control signal $C_{IREF}$ and/or the scaling control signal $C_{SCALE}$ to decrease the rate of increase of the inductor current $i_L$, i.e. decrease $di_L/dt$, and the control signal $CS_1$ is in state 3.

At the beginning of the third charging phase $T_{C\_3}$, the controller 808 reenters an efficient mode for boost switch 904 and increases the inductor current $i_L$ rate of change $di_L/dt$, which reduces power dissipation in the boost switch 904. In state 3, the controller 904 causes the boost switch 904 to operate in a power dissipation mode. The controller 808 intersperses the second power dissipation phase $T_{PD\_2}$ between the intermixed second charging phase $T_2$ and first power dissipation phase $T_{PD\_1}$ by limiting the rate of change $di_L/dt$ of the inductor current $i_L$ to 0. Limiting $di_L/dt$ to 0 holds the inductor current $i_L$ constant and dissipates excess power through the boost switch 904 and in the current source 1002. Controller 808 generates a control signal $CS_1$ that weakly leaves the boost switch 904 ON but allows the flyback phase $T_{FB\_1}$ to be intermixed with a third power dissipation phase $T_{PD\_3}$. During the interspersed power dissipation phase $T_{PD\_4}$, controller 808 turns the boost switch 904 OFF, and controller 808 causes the inductor current $i_L$ to be limited and $di_L/dt$ to equal zero. During the second feedback phase $T_{FB\_2}$, the controller 902 turns the boost switch 904 ON to allow the full inductor current $i_L$ to charge the link capacitor 120.

During power dissipation phase $T_{PD\_4}$, the controller 808 operates the boost switch 904 in a power dissipation mode by generating the control signal $CS_1$ in state 4. State 4 corresponds to a limiting of the inductor current $i_L$ at a lower limit than the limit associated with state 3.

Figure 13:
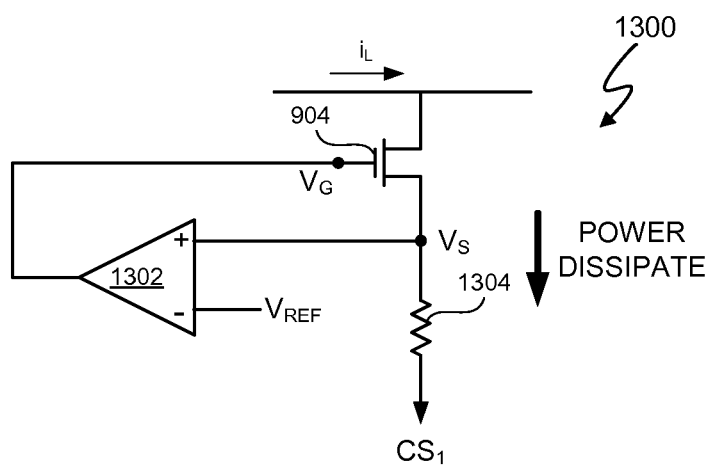
FIG. 13 depicts another embodiment of the switch path power dissipation circuit of FIG. 9.

FIG. 13 depicts switch path power dissipation circuit 1300, which represents one embodiment of the switch path power dissipation circuit 902. Operational amplifier 1302 provides a feedback path to control the gate voltage $V_G$ and source voltage $V_S$ of boost switch 904. The controller 808 controls the reference voltage $V_{REF}$, and the comparator 1302 drives the gate voltage $V_G$ so that the source voltage $V_S$ of the boost switch 904 equals the reference voltage $V_{REF}$. The source voltage $V_S$ and the voltage level of the control signal $CS_1$ create a voltage difference across the power dissipation resistor 1304, which sets the value of the inductor current $i_L$. The inductor current $i_L$ flows through the boost switch 904 and the power dissipation resistor 1304. Since the controller 808 controls the source voltage $V_S$ and the voltage level of the control signal $CS_1$, controller 808 controls the value of the inductor current $i_L$. Thus, the controller 808 can control the inductor current $i_L$ and intermix and/or intersperse power dissipation phases as described in conjunction, for example, with FIGS. 11 and 12. The particular timing and amount of intermixing and interspersing of power dissipation in the switch path power dissipation circuits 902, 1000, and 1300 is a matter of design choice.

Figure 14:
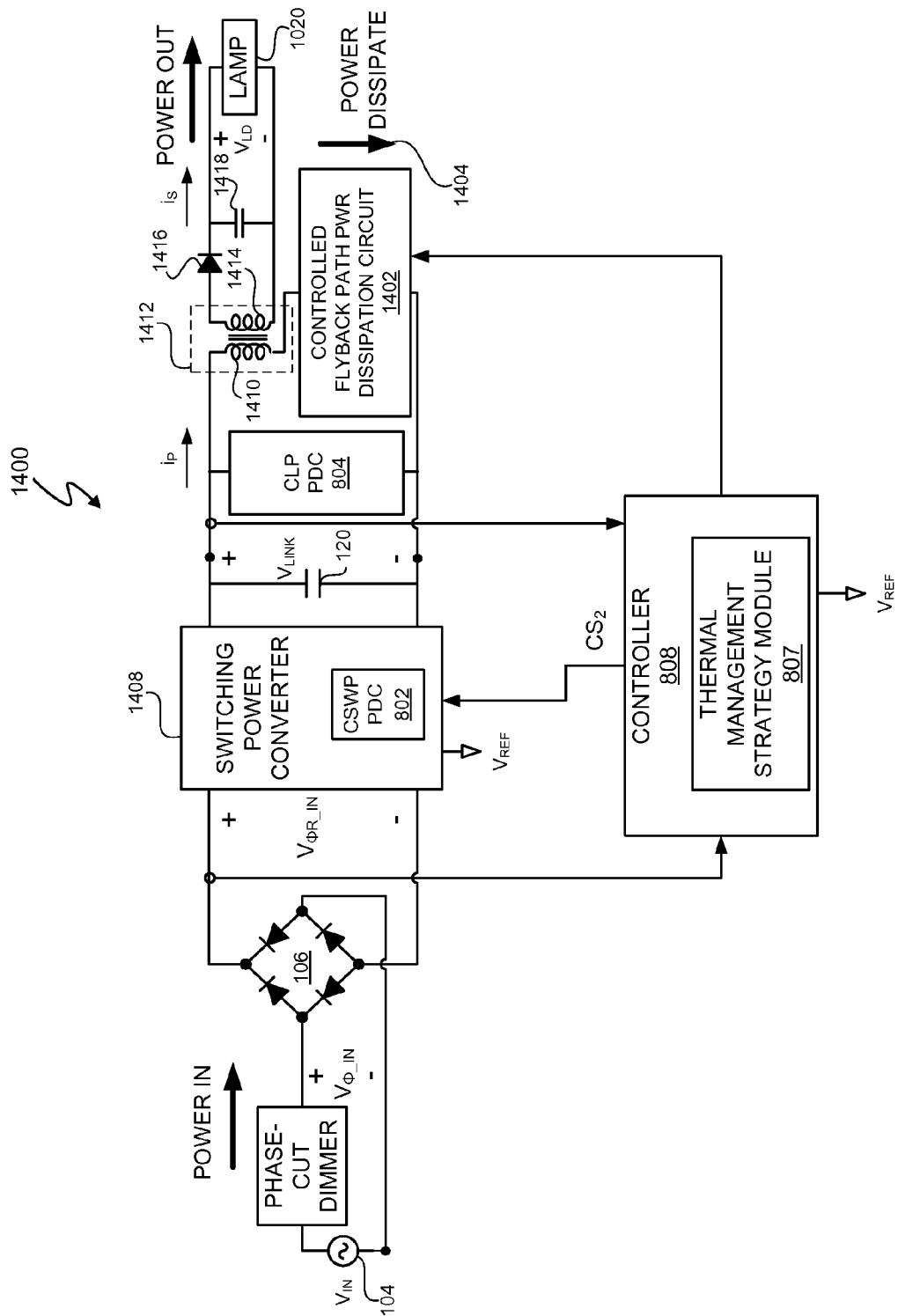
FIG. 14 depicts a lighting system that includes a flyback path power dissipation circuit.

FIG. 14 depicts a lighting system 1400, which represents one embodiment of the lighting system 800. The lighting system 1400 includes a controlled flyback path power dissipation circuit 1402, which represents one embodiment of the controlled flyback path power dissipation circuit 806. In at least one embodiment, the lighting system 1400 controls power dissipation through a flyback path 1404 by controlling a transformer primary current $i_P$ in the flyback path 1402 and limiting the primary current $i_P$ to control power dissipation.

The lighting system 1400 also includes a controller 808 that controls the flyback path power dissipation circuit 1402 and generates control signal $CS_2$ to control switching power converter 1408. In at least one embodiment, switching power converter 1408 is a boost-type switching power converter, such as switching power converter 108 (FIG. 1), and controller 808 controls the switching power converter 1408 as, for example, generally described in Melanson I and Melanson II.

In at least one embodiment, the flyback path power dissipation circuit 1402 modulates the primary current $i_P$ to energize the primary-side coil 1410 of transformer 1412. Transformer 1412 transfers energy from the primary-side coil 1410 to the secondary-side coil 1414 to cause a secondary current $i_S$ to flow through diode 1416 and charge load voltage capacitor 1418 to the load voltage $V_{LD}$. The load voltage $V_{LD}$ provides a voltage across lamp 1020.

When the POWER IN is greater than the POWER OUT+$P_{INH}$, controller 808 operates the flyback path power dissipation circuit 1402 to dissipate excess energy. The particular implementation and operation of the flyback path power dissipation circuit 1402 to dissipate the excess energy is a matter of design choice.

Figure 15:
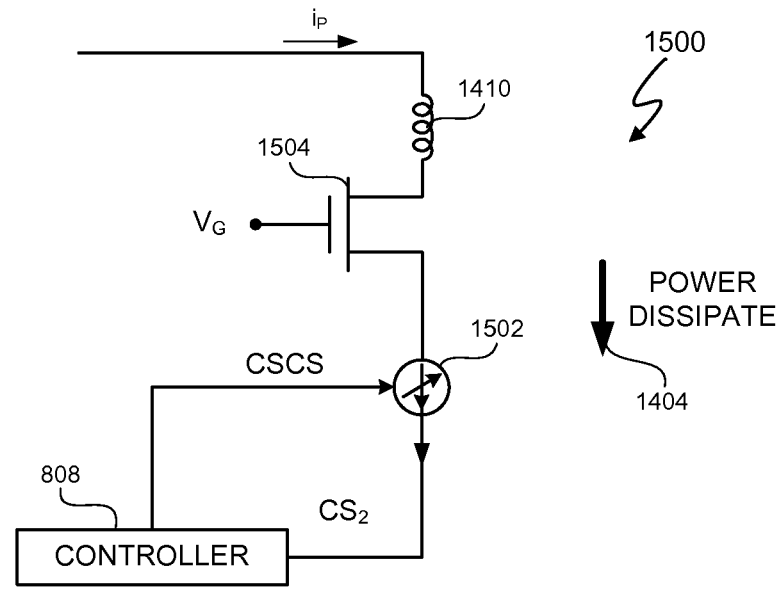
FIGS. 15 and 16 depict respectively embodiments of the flyback path power dissipation circuit of FIG. 14.

FIG. 15 depicts flyback dissipation circuit 1500, which represents one embodiment of the flyback power dissipation circuit 1402. Flyback dissipation circuit 1500 includes controllable current source 1502 to control the primary current $i_P$ through the flyback FET 1504. Controller 808 generates one or more current source control signals CSCS and control signal $CS_2$ to control the primary current through flyback switch 1504. Controlling the primary current $i_P$ allows the flyback dissipation circuit 1500 to control power dissipation in a manner similar to the control of power dissipation in the switch path power dissipation circuit 902 (FIG. 9).

Figure 16:
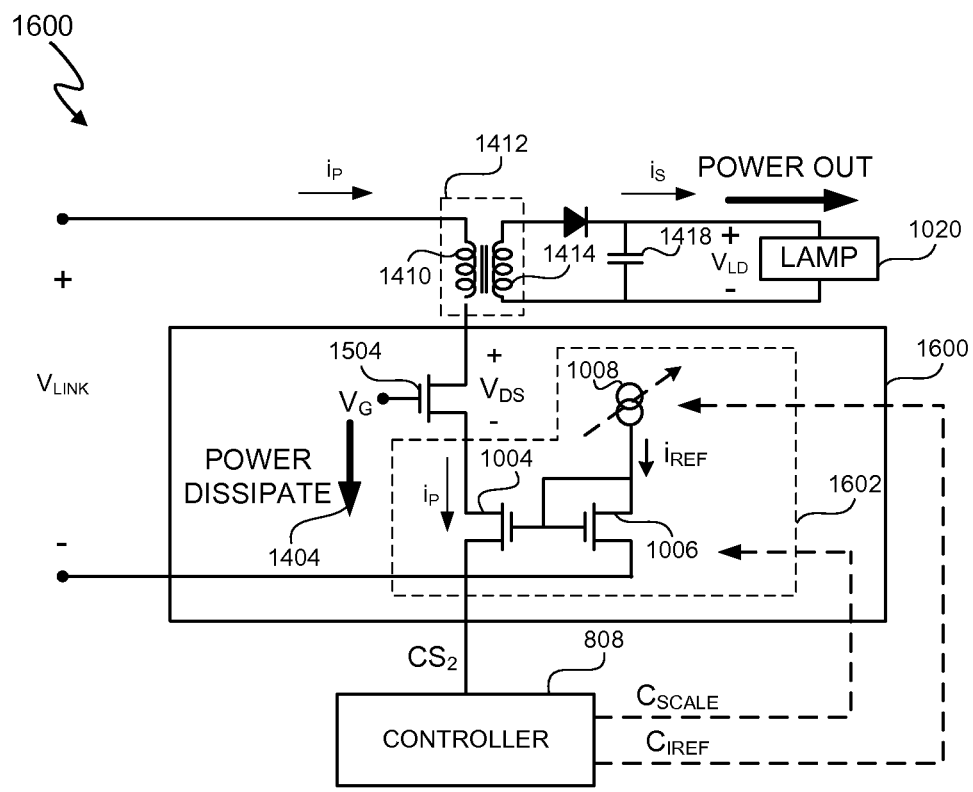

FIG. 16 depicts flyback path power dissipation circuit 1600, which represents one embodiment of flyback path power dissipation circuit 1402. In at least one embodiment, controller 808 controls power dissipation through the flyback path 1404 by controlling the transformer primary current $i_P$ and, for example, limiting the primary current $i_P$ with a current source 1602 and dissipating power in the current source 1602. In at least one embodiment, the current source 1602 is identical to the current source 1002 (FIG. 10) and functions as described in conjunction with current source 1002. In at least one embodiment, the current source 1602 limits the primary current $i_P$ through the flyback FET 1504 to limit the primary current $i_P$ (also referred to as a "flyback current"). Limiting the primary current $i_P$ through the flyback switch 1504 causes the current source 1602 to dissipate power. In at least one embodiment, the controller 808 controls interspersing, intermixing, and sequencing of power dissipation through the flyback switch 1504 and the current source 1602 to control power dissipation by the lighting system 1400 (FIG. 14). As with the lighting system 900, in at least one embodiment, the controller 808 generates the control signal $CS_2$ to operate flyback switch 1504 in an efficient mode when not dissipating power by the flyback switch 1504. Also, as with lighting system 900, the controller 808 generates the control signal $CS_2$ by limiting the primary current $i_P$ to operate the flyback switch 1504 in the power dissipation mode. Thus, the controller 808 generates the control signal $CS_2$ with at least three (3) states. The number of states is a matter of design choice and can be increased or decreased, for example, by controlling different limits of the primary current $i_P$.

Figure 17:
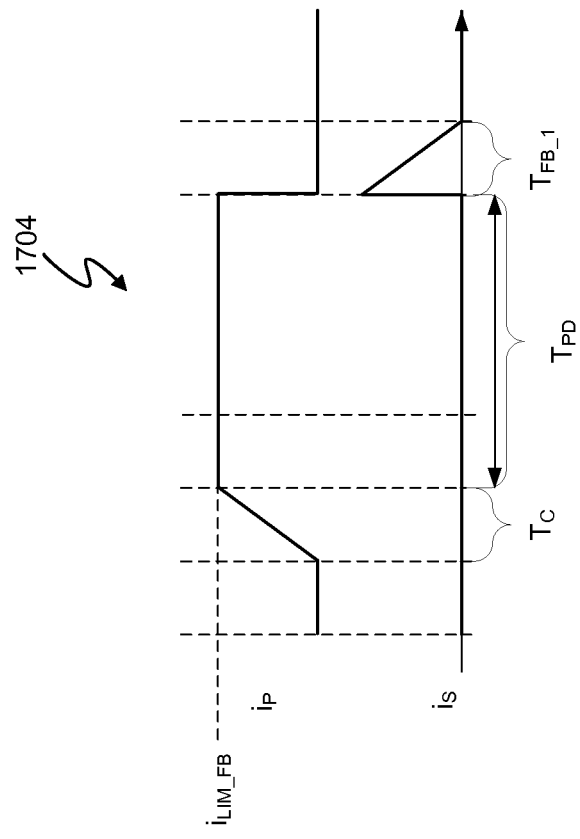
FIGS. 17 and 18 depict exemplary waveforms present during an exemplary operation of the flyback path power dissipation circuits of FIGS. 15 and 17.
Figure 17:
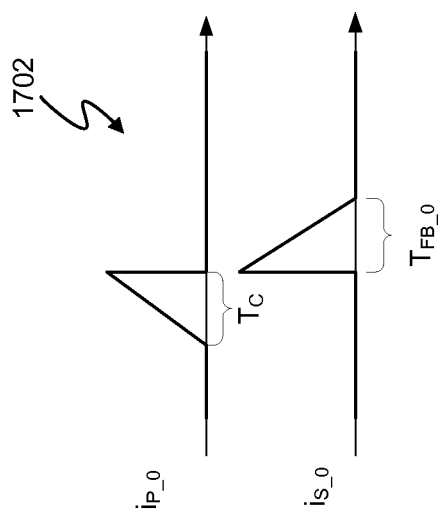

FIG. 17 depicts waveforms 1702 and 1704, which depict exemplary primary-side and secondary-side currents for the flyback power dissipation circuits 1400 and 1500. Referring to FIGS. 12 and 13, current $i_{P\_0}$ and $i_{S\_0}$ in waveforms 1702 represent respective primary-side and secondary-side currents. When there is no active control of power dissipation by controller 808 in the flyback path power dissipation circuit 1600, flyback switch 1504 is ON during the charging phase $T_C$ during which primary-side current $i_{P\_0}$ ramps up. When controller 808 turns the flyback switch 1504 OFF, the flyback phase $T_{FB\_0}$ begins. As with the lighting system 900, in at least one embodiment, the controller 808 generates the control signal $CS_2$ to operate flyback switch 1504 in an efficient mode when not dissipating power by the flyback switch 1504.

Referring to waveforms 1704, when controller 808 actively controls power dissipation in the flyback path power dissipation circuit 1600, in at least one embodiment, the current source 1602 generates the primary-side limit current $i_{LIM\_FB}$ to limit the primary-side current $i_P$ and delay the flyback phase $T_{FB\_1}$ until completion of the power dissipation phase $T_{PD}$. During the power dissipation phase $T_{PD}$, the primary-side current $i_P$ is constant, so the voltage across the primary-side coil 1410 is zero, and power is dissipated through the flyback FET 1504 and the current source 1602.

Figure 18:
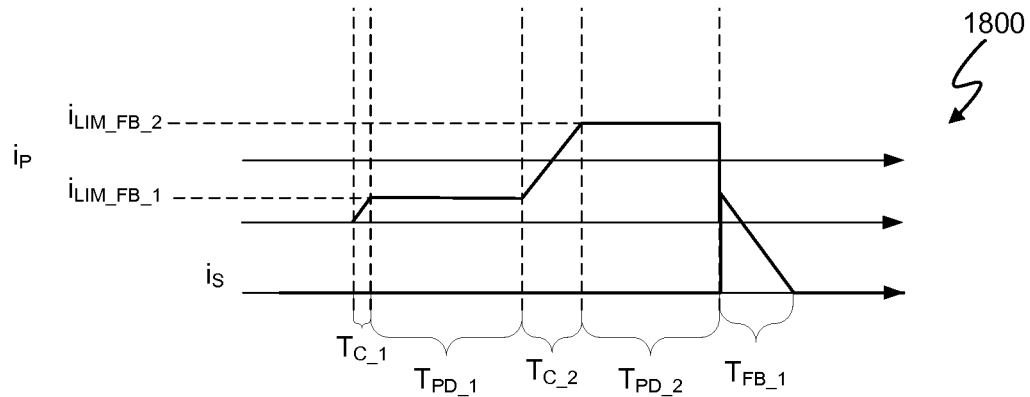

FIG. 18 depicts waveforms 1800, which depict exemplary primary-side and secondary-side currents for the flyback power dissipation circuits 1400 and 1500. In at least one embodiment, the controller 808 coordinate multiple primary-side limit currents, such as limit currents $i_{LIM\_FB\_1}$ and $i_{LIM\_FB\_2}$ to stage the power dissipation by the flyback path power dissipation circuit 1600. Controller 808 can control the multiple limit currents $i_{LIM\_FB\_1}$ and $i_{LIM\_FB\_2}$ by setting the reference current $i_{REF}$ with the controls signal $C_{IREF}$, setting the scaling factor Z with the control signal $C_{SCALE}$, or setting both the reference current $i_{REF}$ and the scaling factor Z, as described in conjunction with the current source 1002 (FIG. 10). Staging the power dissipation by the flyback power dissipation circuit 1600 to, for example, thermally manage power dissipation by the flyback switch 1504 and the current source 1602.

Figure 19:
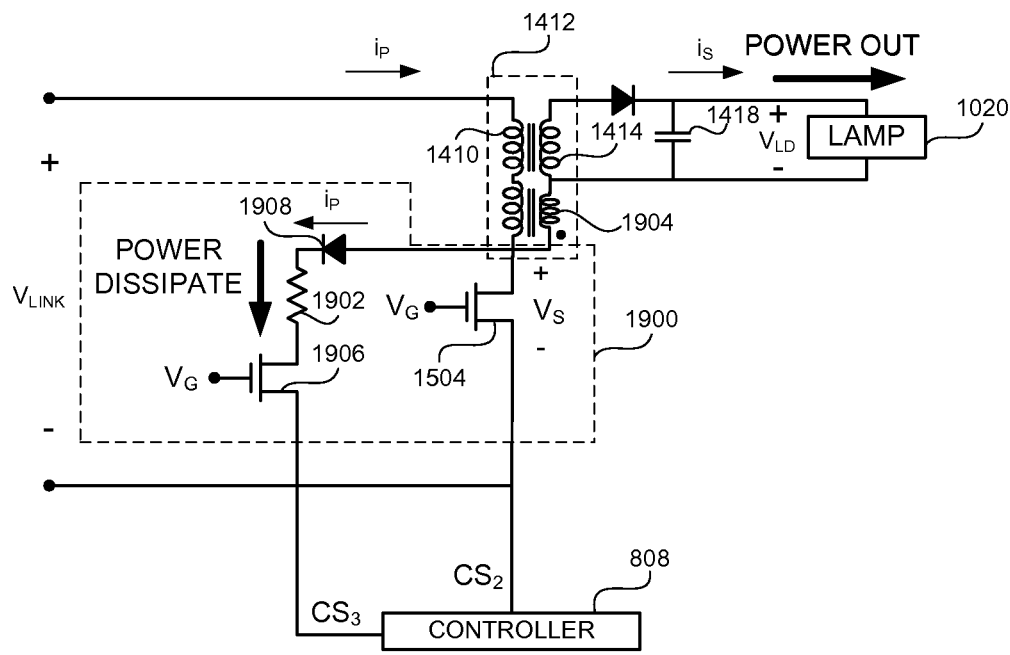
FIG. 19 depicts another embodiment of the flyback path power dissipation circuit of FIG. 14.

FIG. 19 depicts a flyback path power dissipation circuit 1900, which represents one embodiment of the flyback path power dissipation circuit 1402. In at least one embodiment, the flyback path power dissipation circuit 1900 dissipates power through a resistor 1902. An auxiliary power winding 1904 receives energy from the primary-side coil 1210 during a flyback phase of the primary-side coil. A gate voltage $V_G$ biases a gate of FET 1906, and controller 808 controls the conductivity of FET 1906 with source control signal $CS_3$. When the controller 808 determines that POWER IN does not equal POWER OUT+$P_{INH}$, the controller 808 turns FET 1906 ON, which allows current $i_{AUX}$ from the auxiliary winding 1904 to flow through diode 1908 and through resistor 1902. In at least one embodiment, the controller 808 dissipates an amount of power equal to a difference between POWER IN and POWER OUT+$P_{INH}$ over one or more cycles of the auxiliary current $i_{AUX}$.

Figure 20:
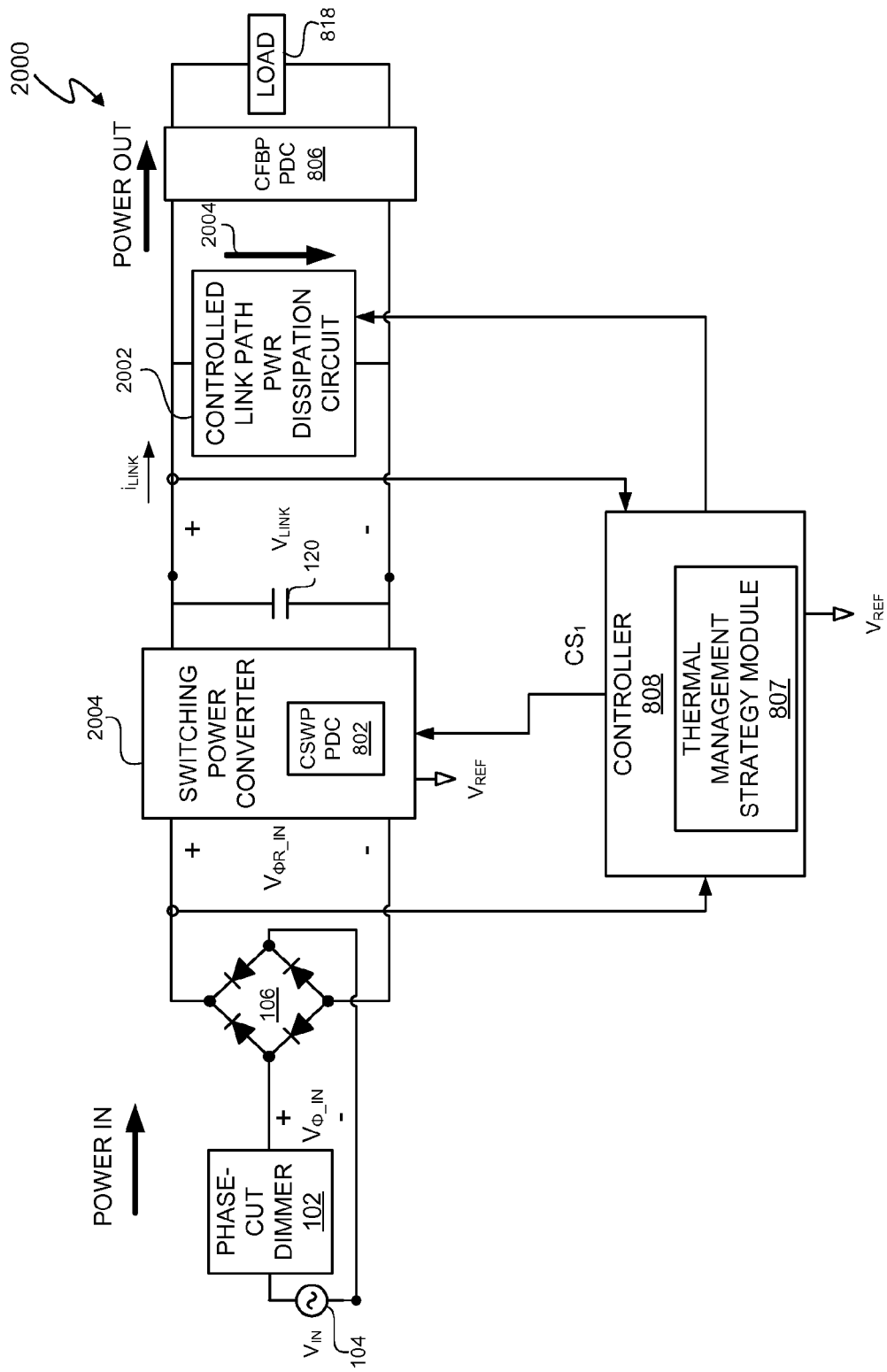
FIG. 20 depicts a lighting system that includes a link path power dissipation circuit.

FIG. 20 depicts a lighting system 2000 that represents one embodiment of lighting system 800. Lighting system 2000 includes a link path power dissipation circuit 2002 to dissipate excess power in the lighting system 2000. The link path power dissipation circuit 2002 represents one embodiment of the link path power dissipation circuit 804. In general, when the POWER IN exceeds the POWER OUT+$P_{INH}$, the link path power dissipation circuit 2002 dissipates excess energy through the output power dissipation path 2004. In at least one embodiment, the link path power dissipation circuit 2002 monitors the link voltage $V_{LINK}$. When the POWER IN exceeds the POWER OUT+$P_{INH}$, the link voltage $V_{LINK}$ will increase if excess energy is not dissipated by the lighting system 2000. Thus, in at least one embodiment, the link path power dissipation circuit 2002 monitors the link voltage $V_{LINK}$, and when the link voltage $V_{LINK}$ exceeds a predetermined reference link voltage, the link path power dissipation circuit 2002 dissipates the excess energy. The particular implementation and control of the link path power dissipation circuit 2002 is a matter of design choice.

Figure 21:
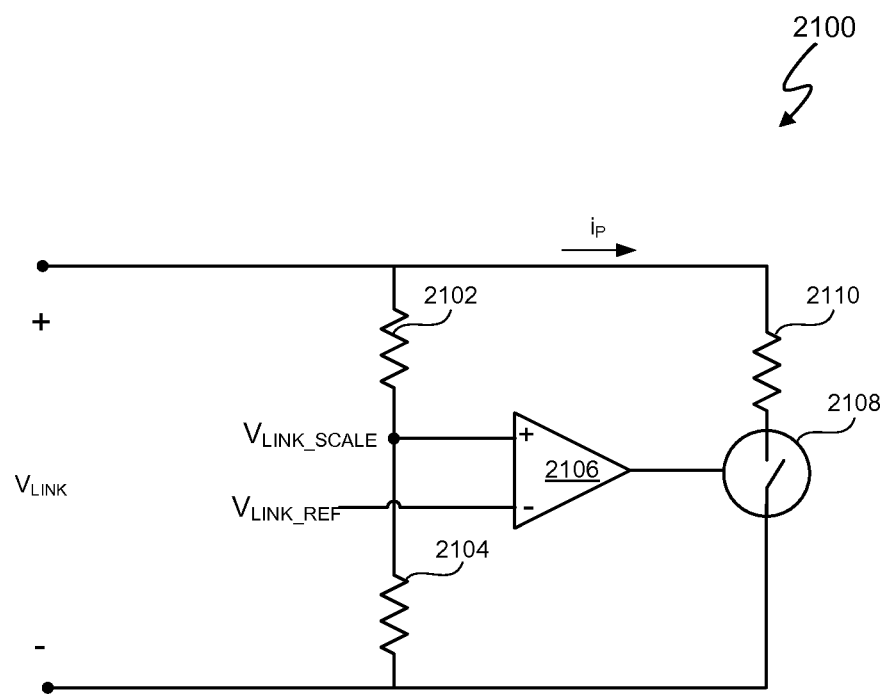
FIGS. 21 and 22 depict respective exemplary embodiments of the link path power dissipation circuit of FIG. 20.

FIG. 21 depicts an exemplary link path power dissipation circuit 2100, which represents one embodiment of the link path power dissipation circuit 2002. The link path power dissipation circuit 2100 includes series connected resistors 2102 and 2104 that form a resistor-based voltage divider to generate a scaled link voltage $V_{LINK\_SCALE}$. The link path power dissipation circuit 2100 monitors the link voltage $V_{LINK}$ by comparing the scaled link voltage $V_{LINK\_SCALE}$ with a reference link voltage $V_{LINK\_REF}$. The reference link voltage $V_{LINK\_REF}$ establishes a threshold for power dissipation by the link path power dissipation circuit 2100. The scaled link voltage $V_{LINK\_SCALE}$ biases the non-inverting input terminal of the comparator 2106, and the reference link voltage $V_{LINK\_REF}$ biases the inverting input terminal of the comparator 2106. When the scaled link voltage $V_{LINK\_SCALE}$ exceeds the reference link voltage $V_{LINK\_REF}$, the comparator 2106 biases a switch 2108, which causes the primary current $i_P$ to flow through power dissipation resistor 2110 and switch 2108. The implementation of switch 2108 is a matter of design choice. In at least one embodiment, switch 2108 is a bipolar junction transistor (BJT), and the comparator 2106 biases a base of the BJT switch 2108. In at least one embodiment, switch 2108 is FET, and the comparator 2106 biases a gate of the FET switch 2108. Reciprocally, when the scaled link voltage $V_{LINK\_SCALE}$ is less than the reference link voltage $V_{LINK\_REF}$, the comparator 2106 turns the switch 2108 OFF, which stops current flow in and power dissipation by the power dissipation resistor 2110. The particular link voltage $V_{LINK}$ corresponding to the reference link voltage $V_{LINK\_REF}$ is a matter of design choice and is, for example, 105%-120% of a normal operating link voltage $V_{LINK}$. In at least one embodiment, the reference link voltage $V_{LINK\_REF}$ is approximately 115% for an input voltage $V_{IN}$ equal to 110 Vrms and 107% for an input voltage $V_{IN}$ equal to 230 Vrms.

Figure 22:
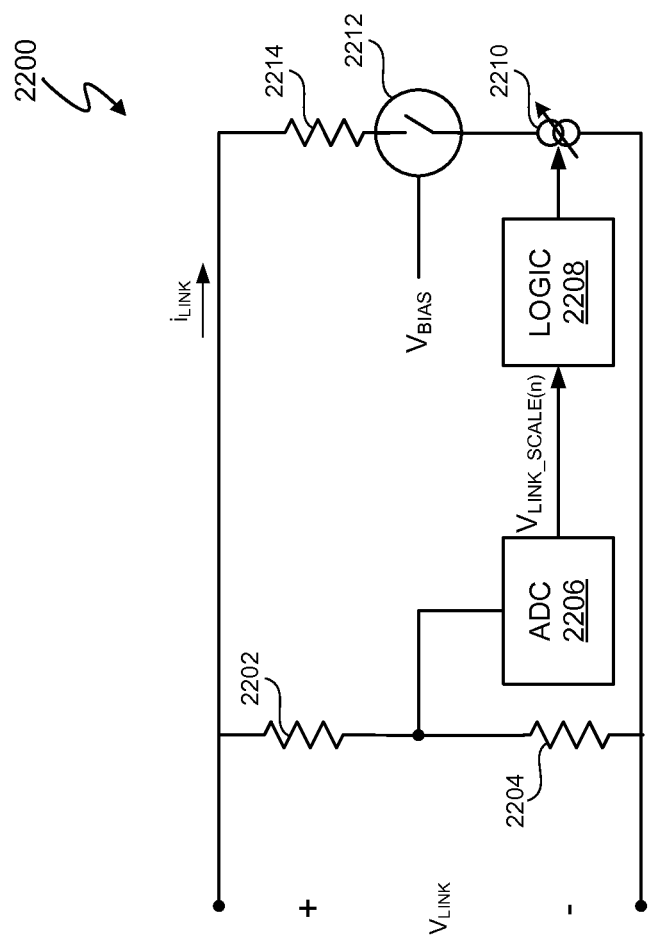

FIG. 22 depicts an exemplary link path power dissipation circuit 2200, which represents one embodiment of the link path power dissipation circuit 2002. The link path power dissipation circuit 2200 includes series connected resistors 2202 and 2204 that form a resistor-based voltage divider to generate a scaled link voltage $V_{LINK\_SCALE}$. The link path power dissipation circuit 2200 monitors the link voltage $V_{LINK}$ by using the analog-to-digital converter 2206 to convert the analog scaled link voltage $V_{LINK\_SCALE}$ into a digital value scaled link voltage $V_{LINK\_SCALE}(n)$. Logic 2208 determines if the link path power dissipation circuit 2200 should dissipate excess energy by determining if the scaled link voltage $V_{LINK\_SCALE}$ indicates that the link voltage $V_{LINK}$ is greater than a particular threshold value. The particular threshold value is a matter of design choice and is, for example, 105%-120% of a normal operating link voltage $V_{LINK}$. If the logic 2208 determines that the link path power dissipation circuit 2200 should dissipate excess energy, the logic 2208 controls conductivity of switch 2212. In at least one embodiment, switch 2212 is a BJT, and the logic 2208 controls the current source 2212 to bias an emitter of the BJT switch 2212 and control flow of the primary current $i_P$ through the power dissipation resistor 2214. In at least one embodiment, switch 2212 is a FET, and the logic 2208 controls the current source 2212 to bias a source of the FET switch 2212 and control flow of the primary current $i_P$ through the power dissipation resistor 2214.

The implementation of the logic 2208 and current source 2210 is a matter of design choice. In at least one embodiment, the current source 2210 is identical to the current source 1002 (FIG. 10), and the logic 2208 can control the reference current (not shown) and/or the scaling factor (not shown) of the current source 2210. In at least one embodiment, the logic 2208 comprises a processor (not shown) that executes code to determine the particular intermixing, interspersing, and limits for the primary current during power dissipation in accordance with a predetermined algorithm. In at least one embodiment, the algorithm is stored as executable code in a memory (not shown) of the logic 2208. The particular algorithm is a matter of design choice. In at least one embodiment, the algorithm causes the power dissipation resistor 2214 to dissipate power until the scaled link voltage $V_{LINK\_SCALE}$ indicates that the link voltage $V_{LINK}$ has declined to a predetermined value, such as a normally operating level for the load 818 (FIGS. 8 and 16).

Figure 23:
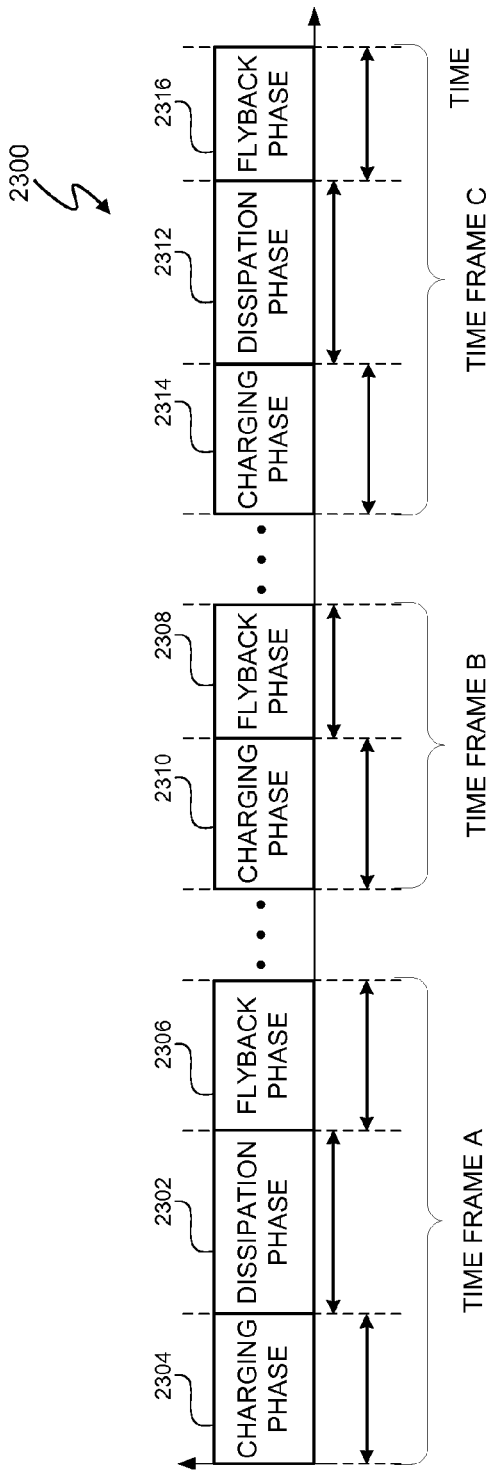
FIG. 23 depicts an exemplary power dissipation phase interspersing timeline.

Referring to FIG. 8, in at least one embodiment, controller 808 controls the switch path power dissipation circuit 802, the link path power dissipation circuit 804, and/or the flyback path power dissipation circuit 806 to dissipate power when the POWER IN is greater than the POWER OUT+ $P_{INH}$ plus the inherent losses of the lighting system 800. In at least one embodiment, the controller 808 can introduce power dissipation phases as needed to dissipate excess energy. FIG. 23 depicts an exemplary power dissipation phase interspersing timeline 2300 for three exemplary time frames A, B, and C. In at least one embodiment, a single timeframe, such as time frames A, B, or C, refers to a time between when a first charging phase following an immediately preceding flyback phase begins and a flyback phase immediately preceding a next charging phase ends. In time frame A, the power dissipation phase 2302 is interspersed between charging phase 2304 and flyback phase 2306. In a subsequent time frame B of the rectified input voltage $V_{\phi R\_IN}$, the flyback phase 2308 immediately follows the charging phase 2310, and, there is no power dissipation phase in time frame B. Time frame B can be a consecutive time frame after time frame A or a non-consecutive time frame. A controller 808 (FIG. 9) can avoid including a power dissipation phase in time frame B for a variety of reasons, such as when the POWER IN equals the POWER OUT+ $P_{INH}$ or to allow components to cool prior to initiating another power dissipation phase. In time frame C of the rectified input voltage $V_{\phi R\_IN}$, controller 808 intersperse the power dissipation phase 2312 between charging phase 2314 and flyback phase 2316.

Figure 24:
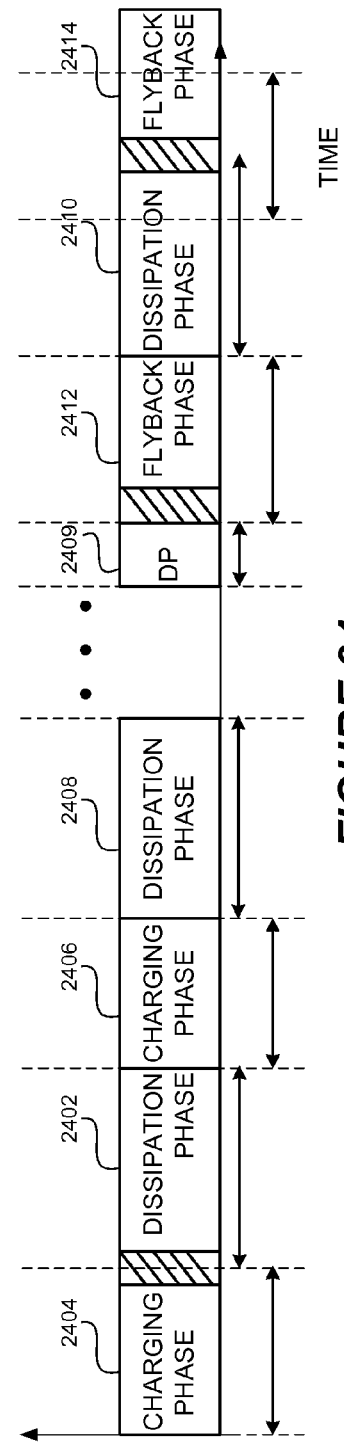
FIG. 24 depicts an exemplary power dissipation intermixing and interspersing timeline.

FIG. 24 depicts an exemplary power dissipation intermixing and interspersing timeline 2400 for a single timeframe. In at least one embodiment, a single timeframe refers to a time between when a first charging phase following an immediately preceding flyback phase begins and a flyback phase immediately preceding a next charging phase ends. The power dissipation phase 2402 is intermixed with the charging phase 2404 and interspersed with a subsequent charging phase 2406. A subsequent power dissipation phase 2408 occurs after the charging phase 2406. The power dissipation phase 2410 is interspersed between flyback phases 2412 and 2414 and also intermixed with flyback phase 2414. The power dissipation phase 2409 begins after the beginning of the charging phase 2406 and before an end of the subsequent flyback phase 2412. The number and timing of interspersed and intermixed charging and flyback phases and power dissipation phases is a matter of design choice and depends on, for example, an amount of power to be dissipated and thermal management of components.

Thus, a lighting system includes a controller that is configured to provide thermal management for the lighting system by distributing excess energy in the lighting system through multiple power dissipation circuits.

Although embodiments have been described in detail, it should be understood that various changes, substitutions, and alterations can be made hereto without departing from the spirit and scope of the invention as defined by the appended claims.

What is claimed is:

1. An apparatus comprising:
a controller configured to (i) select a plurality of power dissipation circuits during any operating mode of the controller in accordance with a thermal management strategy to dissipate excess energy in the selected plurality of power dissipation circuits in a phase cut compatible, dimmable lighting system and (ii) responding to heating conditions in the controller by activating the plurality of power dissipation circuits to distribute heat generation in the controller in accordance with the thermal management strategy, wherein the dimmable lighting system includes one or more light sources selected from a group consisting of at least one light emitting diode and at least one compact fluorescent lamp.

2. The apparatus of claim 1 wherein the power dissipation circuits include two or more power dissipation circuits selected from a group consisting of: a controlled switch path power dissipation circuit, a controlled link path power dissipation circuit, and a controlled flyback path power dissipation circuit.

3. The apparatus of claim 2 wherein the controlled switch path power dissipation circuit is configured to dissipate excess energy by at least a boost switch of a switching power converter during a controlled power dissipation phase, and the controlled power dissipation phase occurs after a charging phase begins and before an end of a subsequent flyback phase of the switching power converter.

4. The apparatus of claim 2 wherein the controlled link path power dissipation circuit is configured to dissipate excess energy to dissipate power in a link path of a switching power converter.

5. The apparatus of claim 2 wherein the controlled flyback path power dissipation circuit is configured to dissipate excess energy by at least a flyback switch during a controlled power dissipation phase, and the controlled power dissipation phase occurs after a charging phase begins and before an end of a subsequent flyback phase of a switching power converter.

6. The apparatus of claim 1 wherein the excess energy comprises energy received by a switching power converter that is greater than an amount of energy to be provided to a load coupled to the switching power converter.

7. The apparatus of claim 1 wherein at least one of the power dissipation circuits is included in a switching power converter.

8. The apparatus of claim 1 wherein the power dissipation circuits are included in power conversion circuitry.

9. The apparatus of claim 1 wherein the controller is further configured to dynamically distribute power dissipation to the power dissipation circuits in response to observed events in the lighting system and in accordance with the thermal management strategy.

10. The apparatus of claim 1 wherein the one or more observed events are selected from a group consisting of: local temperature measurements and activity of each of the power dissipation circuits.

11. The apparatus of claim 1 wherein the controller is further configured to distribute power dissipation to the power dissipation circuits in a preset manner in accordance with the thermal management strategy.

12. The apparatus of claim 1 wherein the controller includes at least one terminal to receive thermal management strategy data, wherein the thermal management strategy data at least in part establishes the thermal management strategy.

13. The apparatus of claim 1 wherein the controller is further configured to receive temperature data from a plurality of thermal sensors to control the plurality of power dissipation circuits in accordance with a thermal management strategy that includes distributing power dissipation to the power dissipation circuits in accordance with the temperature data.

14. The apparatus of claim 1 wherein the thermal management strategy data is specific to a particular type of lighting system.

15. The apparatus of claim 1 wherein the controller is further configured (i) to determine when power into the lighting system should be greater than power out to the one or more light sources and (ii) to distribute power dissipation in the power dissipation circuits that can best tolerate power dissipation in addition to power dissipation during power conversion of input to output power of the lighting system.

16. The apparatus of claim 1 wherein the controller is further configured to control the lighting system in accordance with a power conversion of input to output power to provide energy to the one or more light sources and to control the plurality of power dissipation circuits in accordance with the thermal management strategy in a power dissipation operation that is separate from the power conversion of input to output power.

17. The apparatus of claim 1 wherein one of the power dissipation circuits includes a flyback switch and, in accordance with the thermal management strategy, the controller is further configured to control the flyback switch coupled to a primary-side transformer coil in an output stage of a switching power converter in a phase cut compatible, dimmable lighting system, wherein the controller is further configured control the flyback switch to dissipate excess energy in the flyback switch during a controlled power dissipation phase, and the controlled power dissipation phase occurs after a charging phase begins and before an end of a subsequent flyback phase of the switching power converter, wherein the excess energy comprises more energy than an amount of energy to be provided to a load coupled to the switching power converter plus inherent energy losses.

18. An method comprising:
selecting of a plurality of power dissipation circuits to dissipate excess energy during any operating mode of a controller of a switching power converter; and
responding to heating conditions in a controller of a switching power converter by controlling the plurality of the power dissipation circuits to distribute heat generation in the controller in accordance with a thermal management strategy to dissipate excess energy in the selected plurality of power dissipation circuits in a phase cut compatible, dimmable lighting system having one or more light sources selected from a group consisting of at least one light emitting diode and at least one compact fluorescent lamp.

19. The method of claim 18 wherein the power dissipation circuits include two or more power dissipation circuits selected from a group consisting of: a controlled switch path power dissipation circuit, a controlled link path power dissipation circuit, and a controlled flyback path power dissipation circuit.

20. The method of claim 19 further comprising:
controlling a boost switch of the controlled switch path power dissipation circuit during a controlled power dissipation phase to dissipate at least a part of the excess energy, and the controlled power dissipation phase occurs after a charging phase begins and before an end of a subsequent flyback phase of the switching power converter.

21. The method of claim 19 further comprising:
controlling the link path power dissipation circuit to dissipate at least part of the excess energy in a link path of a switching power converter.

22. The method of claim 19 further comprising:
controlling the flyback path power dissipation circuit to dissipate excess energy by at least a flyback switch during a controlled power dissipation phase, and the controlled power dissipation phase occurs after a charging phase begins and before an end of a subsequent flyback phase of a switching power converter.

23. The method of claim 18 wherein the excess energy comprises energy received by a switching power converter that is greater than an amount of energy to be provided to a load coupled to the switching power converter.

24. The method of claim 18 wherein at least one of the power dissipation circuits is included in a switching power converter.

25. The method of claim 18 wherein the power dissipation circuits are included in power conversion circuitry.

26. The method of claim 18 further comprising:
dynamically distributing power dissipation to the power dissipation circuits in response to observed events in the lighting system and in accordance with the thermal management strategy.

27. The method of claim 18 wherein the one or more observed events are selected from a group consisting of: local temperature measurements and activity of each of the power dissipation circuits.

28. The method of claim 18 further comprising:
distributing power dissipation to the power dissipation circuits in a preset manner in accordance with the thermal management strategy.

29. The method of claim 18 wherein the controller includes at least one terminal to receive thermal management strategy data, wherein the thermal management strategy data at least in part establishes the thermal management strategy.

30. The method of claim 18 further comprising:
receiving temperature data from a plurality of thermal sensors to control the plurality of power dissipation circuits in accordance with a thermal management strategy; and
distributing power dissipation to the power dissipation circuits in accordance with the temperature data.

31. The method of claim 18 wherein the thermal management strategy data is specific to a particular type of lighting system.

32. The method of claim 18 wherein controlling the plurality of power dissipation circuits in accordance with the thermal management strategy further comprises:

determining when power into the lighting system should be greater than power out to the one or more light sources; and
controlling the plurality of power dissipation circuits to distribute power dissipation in the power dissipation circuits that can best tolerate power dissipation in addition to power dissipation during a power conversion of input to output power of the lighting system.

33. The method of claim 18 further comprising:
controlling the lighting system in accordance with a power conversion of input to output power of the lighting system to provide energy to the one or more light sources; and
wherein controlling the plurality of power dissipation circuits in accordance with the thermal management strategy further comprises:
controlling the plurality of power dissipation circuits in accordance with the thermal management strategy in a power dissipation operation that is separate from the power conversion of input to output power.

34. The method of claim 18 wherein one of the power dissipation circuits includes a flyback switch coupled to a primary-side transformer coil in an output stage of a switching power converter in a phase cut compatible, dimmable lighting system, the method further comprising:
in accordance with the thermal management strategy:
controlling the flyback switch to dissipate excess energy in the flyback switch during a controlled power dissipation phase, and the controlled power dissipation phase occurs after a charging phase begins and before an end of a subsequent flyback phase of the switching power converter, wherein the excess energy comprises more energy than an amount of energy to be provided to a load coupled to the switching power converter plus inherent energy losses.

35. An apparatus comprising:
means for selecting a plurality of power dissipation circuits to dissipate excess energy during any operating mode of a controller of a switching power converter; and
means for responding to heating conditions in a controller of a switching power converter by controlling the plurality of the power dissipation circuits to distribute heat generation in the controller in accordance with a thermal management strategy to dissipate excess energy in the selected plurality of power dissipation circuits in a phase cut compatible, dimmable lighting system having one or more light sources selected from a group consisting of at least one light emitting diode and at least one compact fluorescent lamp.

36. The apparatus of claim 35 wherein one of the power dissipation circuits includes a flyback switch coupled to a primary-side transformer coil in an output stage of a switching power converter in a phase cut compatible, dimmable lighting system, the apparatus further comprising:
means for controlling the flyback switch, in accordance with the thermal management strategy, to dissipate excess energy in the flyback switch during a controlled power dissipation phase, and the controlled power dissipation phase occurs after a charging phase begins and before an end of a subsequent flyback phase of the switching power converter, wherein the excess energy comprises more energy than an amount of energy to be provided to a load coupled to the switching power converter plus inherent energy losses.

* * * * *